(12) United States Patent
Hibino et al.

(10) Patent No.: US 7,755,391 B2
(45) Date of Patent: Jul. 13, 2010

(54) THREE-VALUED LOGIC FUNCTION CIRCUIT

(75) Inventors: Yasushi Hibino, Nomi (JP); Masaaki Shirase, Hakodate (JP)

(73) Assignee: Japan Advanced Institute of Science and Technology, Ishikawa (JP)

( * ) Notice: Subject to any disclaimer, the term of this patent is extended or adjusted under 35 U.S.C. 154(b) by 59 days.

(21) Appl. No.: 12/162,760

(22) PCT Filed: Jan. 31, 2007

(86) PCT No.: PCT/JP2007/051620

§ 371 (c)(1),
(2), (4) Date: Dec. 5, 2008

(87) PCT Pub. No.: WO2007/088901

PCT Pub. Date: Aug. 9, 2007

(65) Prior Publication Data

US 2009/0295428 A1    Dec. 3, 2009

(30) Foreign Application Priority Data

Jan. 31, 2006    (JP) .............................. 2006-023474

(51) Int. Cl.
*H03K 19/00* (2006.01)
*H03K 19/02* (2006.01)
(52) U.S. Cl. ........................................ 326/59; 326/113
(58) Field of Classification Search ............. 326/59–60, 326/113
See application file for complete search history.

(56) References Cited

U.S. PATENT DOCUMENTS 6,133,754 A    10/2000   Olson 6,828,838 B1 *  12/2004  Anshumali et al. .......... 327/208

(Continued)

FOREIGN PATENT DOCUMENTS

JP    61-5623    1/1986

(Continued)

OTHER PUBLICATIONS

International Preliminary Report on Patentability for PCT/JP2007/051620, mailed Aug. 14, 2008.

(Continued)

*Primary Examiner*—Rexford N Barnie
*Assistant Examiner*—Jany Tran
(74) *Attorney, Agent, or Firm*—Foley & Lardner LLP

(57) ABSTRACT

There is provided a three-valued logic function circuit capable of remarkably reducing the kinds of basic circuits necessary for realizing all $3^{3^2}=19683$ kinds of two-variable three-valued logic function circuits, remarkably reducing asymmetry of the switching time, and improving an operation speed and symmetry of waveform of the logic function circuit. In a three-valued logic function circuit, three transfer gates T1, T2, and T3 are turned on or off by one-variable three-valued logic function circuits C1, D1, C3 and D3, according to three logic values −1, 0, and 1 constituting a first input a, to select outputs of three one-variable three-valued logic function circuits B1, B2, and B3 connected to a second input b. The transfer gate T2 is configured by parallel connection of a switch pair of serial connection of two n-type MOS transistors and a switch pair of serial connection of two p-type MOS transistors.

12 Claims, 34 Drawing Sheets

U.S. PATENT DOCUMENTS

2003/0058001 A1* 3/2003 Boerstler et al. ............ 326/113
2007/0143647 A1* 6/2007 Klass ........................ 714/718
2008/0303554 A1* 12/2008 Chiang et al. ............... 326/113

FOREIGN PATENT DOCUMENTS

| JP | 7-38420 | 2/1995 |
|---|---|---|
| JP | H07-212220 | 8/1995 |
| JP | 2002-517937 | 6/2002 |
| JP | 2006-191394 | 7/2006 |

OTHER PUBLICATIONS

Wu, X.W., "CMOS Ternary Logic Circuits", *IEE Proceedings; Part G JN: A01060B; ISSN: 0143-7089; CODEN: IPGSEB*; vol. 137; No. 1; pp. 21-27; Feb. 1990.

Chang, et al., "Synthesis of Multi-Variable MVL Functions Using Hybrid Mode CMOS Logic", *Proc IEEE Int. Symp. Muliple-Valued LogicJN: B0822B; ISSN: 0195-623X*; vol. 24, pp. 34-41, 1994.

Temel, et al., "Multi-Valued Logic Function Implementation with Novel Current—Mode Logic Gates", *IEE Int. Symp. Circuts System JN: A0757AVOL.*, vol. 1; pp. I.881-I.884; 2002.

* cited by examiner

ENHANCEMENT-TYPE
n-MOS
Vth=1.5V

ENHANCEMENT-TYPE
n-MOS
Vth=0.5V

ENHANCEMENT-TYPE
p-MOS
Vth=1.5V

ENHANCEMENT-TYPE
p-MOS
Vth=0.5V

ENHANCEMENT-TYPE
n-MOS
Vth=0.5V

ENHANCEMENT-TYPE
p-MOS
Vth=0.5V

DEPLETION-TYPE
n-MOS(p-MOS)
Vth=0.5V(0.5V)

f13=>(0,0,-1)

f19=>(1,-1,-1)

f22=>(1,0,-1)

f23=>(1,0,0)

f16=>(0,1,-1)

f08=>(-1,1,0)

THREE-VALUED LOGIC FUNCTION CIRCUIT

TECHNICAL FIELD

The present invention relates to a three-valued logic function circuit that carries out a two-variable three-valued logic operation.

BACKGROUND ART

Recently, various kinds of applications for complicated logic operations such as Public Key Infrastructure (PKI) have been developed according to high performance of information processing apparatuses such as computers. In past, there were proposed multi-valued logic function circuits using a MOS (Metal Oxide semiconductor) device. Among them, attention has been paid to a three-valued logic function circuit having good properties in consideration of relation between the number of necessary elements and performance.

As a general method of realizing a three-valued logic function circuit using the MOS device, there has been known a method using a transistor having a threshold voltage changed by controlling a channel dope amount of a MOS transistor. However, in such a method, a p-type MOS transistor or an n-type MOS transistor is used. That is, as the known three-valued logic function circuit, there is no efficient circuit using a CMOS (Complementary MOS). There was no proposal except a current mode CMOS multi-valued logic function circuit in which current constantly flows, which does not have an operation characteristic of CMOS that current does not flows except the switching time (e.g., see Patent Document 1, and Non-Patent Documents 1 to 3, etc.).

Patent Document 1: Japanese Patent Laid-Open Application No. 7-212220

Non-Patent Document 1: WU X W, PROSSER F P, "CMOS ternary logic circuits", IEE Proc Part G JN: A0160B; ISSN: 0143-7089; CODEN: IPGSEB VOL. 137 NO. 1; PAGE. 21-27; (1990/02)

Non-Patent Document 2: CHANG Y-J, LEE C L, "Synthesis of Multi-Variable MVL Functions Using Hybrid Mode CMOS Logic", Proc IEEE Int Symp Multiple-Valued LogicJN: B0822B; ISSN: 0195-623XVOL. 24th; PAGE. 35-41; (1994)

Non-Patent Document 3: TEMEL T, MORGUL A, "Multi-valued logic function implementation with novel current-mode logic gates", IEEE Tnt Symp Circuits Syst JN: A0757AVOL. 2002 NO. Vol. 1; PAGE. I.881-I.864; (2002)

Under such a circumference, the invention disclosed in Patent Document 2 was made by Mr. OLSON, Edgar Danny. According to this invention, there were used plural kinds of a p-type MOS transistor and an n-type MOS transistor having threshold voltages changed by controlling channel dope amounts of the p-type MOS transistor and the n-type MOS transistor, and it was possible to make a multi-valued logic function circuit having an operation characteristic of CMOS that current does not flows except the operating time.

Patent Document 2: Japanese Translation version Patent Publication No. 2002-517937

The case of applying the technique disclosed in Patent Document 2 to the three-valued logic function circuit will be described. That is, in this three-valued logic function circuit, three logic values are represented by −1, 0, 1, corresponding to a negative voltage, a ground voltage (o volt), and a positive voltage, respectively. As shown in FIG. 45, switch circuits SW1, SW2, and SW3, each of which is formed of one or more MOS transistors, are inserted between a power source for supplying a positive voltage and an output terminal, between a ground and the output terminal, and between a power source for supplying a negative voltage and the output terminal. Each of these switch circuits SW1, SW2, and SW3 is formed of arrangement of a p-type MOS transistor and an n-type MOS transistor, and a MOS transistor circuit having an appropriately set threshold voltage, so that each thereof is exclusively turned on according to input voltages corresponding to input logic values −1, 0, 1. In the technique disclosed in Patent Document 2, with such a configuration only, there are $3^{3^2}=3^9=19683$ kinds although limiting to all two-variable three-valued logic functions. In addition, there is described that it is possible to realize all three-valued logic operations by appropriate use of two kinds of specific inverters (1, −1, 1) and (1, 1, −1) for the respective inputs, in consideration of the point that it is impossible to realize all.

DESCRIPTION OF REFERENCE NUMERALS AND SIGNS

Figure 1:
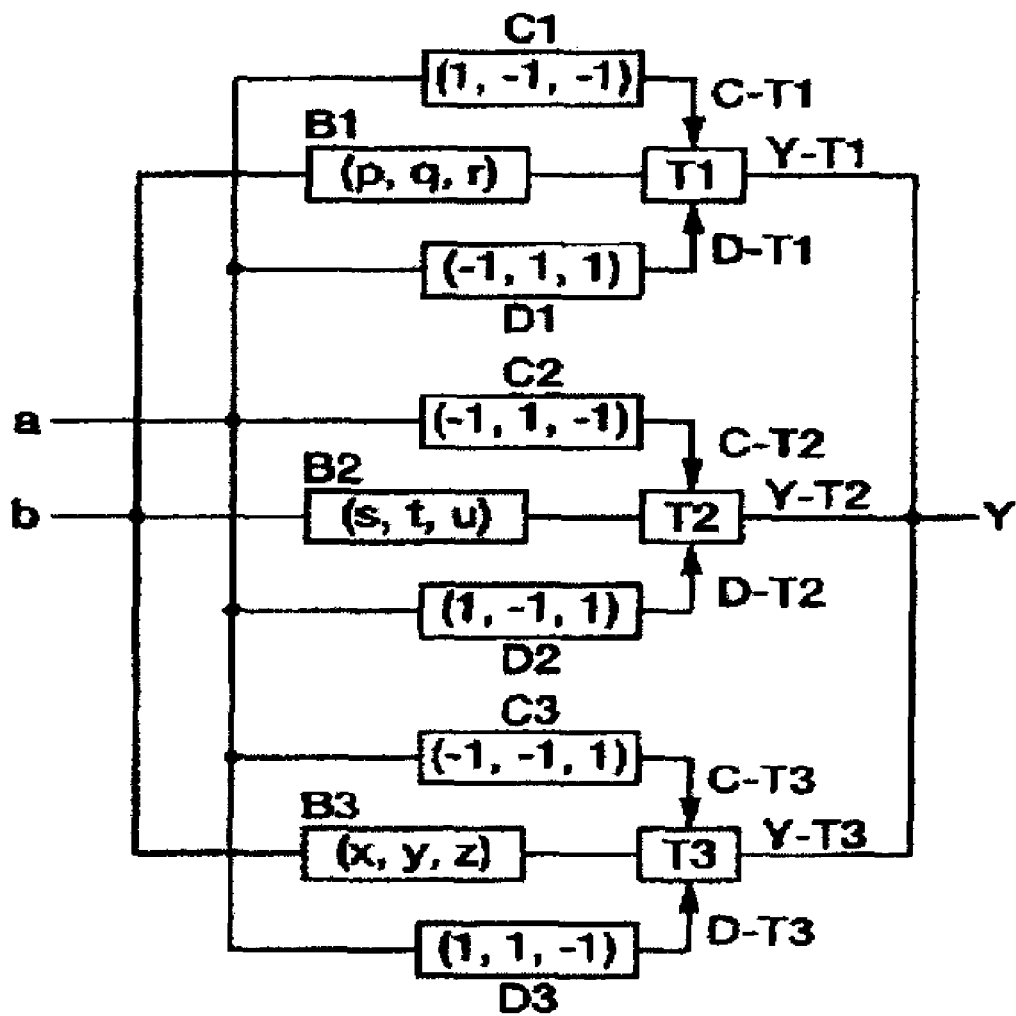
FIG. 1 is a diagram illustrating a configuration of a three-valued logic function circuit previously filed by the applicant of the invention.

B1, B2, B3, C1, C3, D1, D3: ONE-VARIABLE THREE-VALUED LOGIC FUNCTION CIRCUIT
C-T1, C-T2, C-T3, D-T1, D-T2, D-T3: CONTROL TERMINAL
T1, T2, T3: TRANSFER GATE
Y, Y-T1, Y-T2, Y-T3: OUTPUT TERMINAL
nd, ne, nt, NE: n-TYPE MOS TRANSISTOR
pd, pe, pt, PE: p-TYPE MOS TRANSISTOR

DISCLOSURE OF THE INVENTION

Problems to be Solved by the Invention

However, in the technique disclosed in Patent Document 2, to realize all three-valued logic operations, it is necessary to prepare thousands kinds of respective logic function circuits. This means that thousands kinds of basic patterns to be prepared as libraries are necessary, in case of realizing a three-valued logic operation by an integrated circuit. Accordingly, in actual, it is impossible to design a three-valued logic integrated circuit.

In addition, in this technique, circuits are used in which p-type MOS transistors and n-type MOS transistors are complicatedly connected in parallel and/or series as switch circuits inserted between each of a power source for supplying a negative voltage, a ground, and a power source for supplying a positive voltage; and an output terminal. Accordingly, there is a problem that a switching time characteristic of Start and End becomes asymmetry due to asymmetry of characteristics of the p-type MOS transistor and the n-type MOS transistor. That is, in this technique, as a result, a changing time from a logic value −1 to a logic value 1 is largely different from a changing time from a logic value 1 to a logic value −1. In a synchronization digital logic function circuit, to easily make a timing design, it is preferable to reduce the asymmetry of the switching time as small as possible.

The invention has been made in consideration of such a circumference, and an object of the invention is to provide a three-valued logic function circuit is capable of remarkably reducing the kinds of basic circuits and the number of transistors necessary for realizing all of $3^{3^2}=19683$ kinds of two-variable three-valued logic function circuits, remarkably decreasing asymmetry of the switching time, and improving an operation speed as well as symmetry of waveform of the logic function circuit.

Means for Solving the Problems

According to the invention, there is provided a three-valued logic function circuit that carries out a two-variable three-valued logic operation, the circuit comprising: a first transfer gate that is turned on according to a first logic value of three logic values constituting a first input; a second transfer gate that is configured by connecting a first switch pair of serial connection of two n-type MOS transistors and a second switch pair of serial connection of two p-type MOS transistors in parallel to each other, and that is turned on according to a second logic value of three logic values constituting the first input; a third transfer gate that is turned on according to a third logic value of three logic values constituting the first input; a first one-variable three-valued logic function circuit that is connected to one control terminal of two control terminals of the first transfer gate, and one control terminal of two control terminals of the first switch pair or the second switch pair constituting the second transfer gate, and that obtains a first output from the first input; a second one-variable three-valued logic function circuit that is connected to the other control terminal of two control terminals of the first transfer gate, and one control terminal of two control terminals of the switch pair different from the switch pair connected to the first one-variable three-valued logic function circuit of the first switch pair or the second switch pair constituting the second transfer gate, and that obtains a second output complementarily symmetric with the first output from the first input; a third one-variable three-valued logic function circuit that is connected to one control terminal of two control terminals of the third transfer gate, and the other control terminal of two control terminals of the same switch pair as the switch pair connected to the first one-variable three-valued logic function circuit of the first switch pair or the second switch pair constituting the second transfer gate, and that obtains a third output from the first input; a fourth one-variable three-valued logic function circuit that is connected to the other control terminal of two control terminals of the third transfer gate, and the other control terminal of two control terminals of the same switch pair as the switch pair connected to the second one-variable three-valued logic function circuit of the first switch pair or the second switch pair constituting the second transfer gate, and that obtains a fourth output complementarily symmetric with the third output from the first input; a fifth one-variable three-valued logic function circuit that is connected to an input terminal of the first transfer gate, and that obtains a fifth output according to a first logic value of three logic values constituting a second input; a sixth one-variable three-valued logic function circuit that is connected to an input terminal of the second transfer gate, and that obtains a sixth output according to a second logic value of three logic values constituting the second input; and a seventh one-variable three-valued logic function circuit that is connected to an input terminal of the third transfer gate, and that obtains a seventh output according to a third logic value of three logic values constituting the second input, wherein output terminals of the first to third transfer gates are connected by Wired OR.

The three-valued logic function circuit according to the invention turns on or off the first to third transfer gates by the first to fourth one-variable three-valued logic function circuits according to three logic values constituting the first input, and selects an output of the fifth to seventh one-variable three-valued logic function circuits connected to the second input. Accordingly, in the three-valued logic function circuit according to the invention, it is possible to remarkably reduce the kinds of basic circuits necessary for realizing all two-variable three-valued logic function circuits, and it is possible to remarkably decrease the asymmetry of the switching time of Start and End by configuring all three-valued logic elements using only one-variable three-valued logic function circuits. In addition, in the three-valued logic function circuit according to the invention, since the transfer gate logic is configured between control signals in the transfer gates formed of the MOS transistors, it is possible to reduce the number of logic function circuits necessary for controlling the transfer gates, and thus it is possible to remarkably reduce the number of transistors necessary for realizing all two-variable three-valued logic function circuits.

Specifically, the first transfer gate is turned on according to a logic value −1 of three logic values −1, 0, and 1 constituting the first input, the second transfer gate is turned on according to a logic value 0 of three logic values −1, 0, and 1 constituting the first input, the third transfer gate is turned on according to a logic value 1 of three logic values −1, 0, and 1 constituting the first input, the first one-variable three-valued logic function circuit obtains an output (1, −1, −1) from the first input (−1, 0, 1), the second one-variable three-valued logic function circuit obtains an output (−1, 1, 1) from the first input (−1, 0, 1), the third one-variable three-valued logic function circuit obtains an output (−1, −1, 1) from the first input (−1, 0, 1), and the fourth one-variable three-valued logic function circuit obtains an output (1, 1, −1) from the first input (−1, 0, 1).

The three-valued logic function circuit according to the invention may include, instead of the second one-variable three-valued logic function circuit, an inverter that is connected to the other control terminal of two control terminals of the first transfer gate, and the other control terminal of two control terminals of the same switch pair as the switch pair connected to the first one-variable three-valued logic function circuit of the first switch pair or the second switch pair constituting the second transfer gate, and that inverts an output of the first one-variable three-valued logic function circuit.

The three-valued logic function circuit according to the invention may include, instead of the third one-variable three-valued logic function circuit, an inverter that is connected to one control terminal of two control terminals of the third transfer gate, and one control terminal of two control terminals of the switch pair different from the switch pair connected to the first one-variable three-valued logic function circuit of the first switch pair or the second switch pair constituting the second transfer gate, and that inverts an output of the fourth one-variable three-valued logic function circuit.

With such a configuration, in the three-valued logic function circuit according to the invention, it is possible to reduce the number of necessary elements.

In the three-valued logic function circuit according to the invention, each of the first to third transfer gates is formed of an enhancement n-type MOS transistor and an enhancement p-type MOS transistor, the enhancement n-type MOS transistor has a positive threshold voltage smaller than a threshold voltage of a normal enhancement n-type transistor, and the enhancement p-type MOS transistor has a negative threshold voltage smaller in absolute value than a threshold voltage of a normal enhancement p-type transistor.

As described above, in the three-valued logic function circuit according to the invention, it is possible to improve the operation speed as well as the symmetry of wave form of the three-valued logic function circuit, by optimizing the threshold voltages of the MOS transistors constituting the first to third transfer gates, together with the MOS transistor constituting the one-variable logic function circuit.

In the three-valued logic function circuit according to the invention, each of the fifth to seventh one-variable three-valued logic function circuit is any one of a first inverse circuit that obtains an output (0, −1, −1) from the second input (−1, 0, 1), a second inverse circuit that obtains an output (0, 0, −1) from the second input (−1, 0, 1), a third inverse circuit that obtains an output (1, −1, −1) from the second input (−1, 0, 1), a fourth inverse circuit that obtains an output (1, 0, −1) from the second input (−1, 0, 1), a fifth inverse circuit that obtains an output (1, 0, 0) from the second input (−1, 0, 1), a sixth inverse circuit that obtains an output (1, 1, −1) from the second input (−1, 0, 1), a seventh inverse circuit that obtains an output (1, 1, 0) from the second input (−1, 0, 1), a first non-inverse circuit that obtains an output (0, −1, 0) from the second input (−1, 0, 1), a second non-inverse circuit that obtains an output (0, −1, 1) from the second input (−1, 0, 1), a third non-inverse circuit that obtains an output (1, −1, 0) from the second input (−1, 0, 1), a fourth non-inverse circuit that obtains an output (1, −1, 1) from the second input (−1, 0, 1), a fifth non-inverse circuit that obtains an output (1, 0, 1) from the second input (−1, 0, 1), a first complementary symmetry circuit that obtains an output complementarily symmetric with the output of the first non-inverse circuit, a second complementary symmetry circuit that obtains an output complementarily symmetric with the output of the second non-inverse circuit, a third complementary symmetry circuit that obtains an output complementarily symmetric with the output of the third non-inverse circuit, a fourth complementary symmetry circuit that obtains an output complementarily symmetric with the output of the fourth non-inverse circuit, and a fifth complementary symmetry circuit that obtains an output complementarily symmetric with the output of the fifth non-inverse circuit.

That is, the three-valued logic function circuit according to the invention can be systematically realized using only 17 kinds of two-variable three-valued logic function circuits among 27 kinds of two-variable three-valued logic function circuits. In these 17 kinds of one-variable three-valued logic function circuits, all transistors are turned off except the time of the switching operation and current does not flow. Therefore, in the three-valued logic function circuit according to the invention, it is possible to remarkably reduce power consumption as well as the general CMOS two-valued logic function circuit.

In the three-valued logic function circuit according to the invention, the third non-inverse circuit has an enhancement p-type MOS transistor connected to a source logic value 0 having a negative threshold voltage smaller in absolute value than a threshold voltage of a normal enhancement p-type MOS transistor, the fifth non-inverse circuit has an enhancement n-type MOS transistor connected to a source logic value 0 having a positive threshold voltage smaller than a threshold voltage of a normal enhancement n-type MOS transistor, the second complementary symmetry circuit has an enhancement n-type MOS transistor connected to a source logic value 0 having a positive threshold voltage smaller than a threshold voltage of a normal enhancement n-type MOS transistor, and the fifth complementary symmetry circuit has an enhancement p-type MOS transistor connected to a source logic value 0 having a negative threshold voltage smaller in absolute value than a threshold voltage of a normal enhancement p-type MOS transistor.

As described above, in the three-valued logic function circuit according to the invention, it is possible to improve the operation speed and the symmetry of wave form of the three-valued logic function circuit, by optimizing threshold voltages of the MOS transistors constituting the one-variable logic function circuits.

ADVANTAGE OF THE INVENTION

According to the invention, it is possible to remarkably reduce the kinds of basic circuits and the number of transistor necessary for realizing all of $3^{3^2}=19683$ kinds of two-variable three-valued logic function circuits, to remarkably decrease asymmetry of the switching time of Start and End, and to improve the operation speed and the symmetry of waveform of the logic function circuit.

BEST MODE FOR CARRYING OUT THE INVENTION

Hereinafter, exemplary embodiments according to the invention will be described in detail with reference to the drawings.

The present embodiment is a three-valued logic function circuit that carries out two-variable three-valued logic operations. Particularly, the three-valued logic function circuit is to provide indication capable of systemically realizing the three-valued logic function circuit using only 17 kinds of one-variable three-valued logic function circuit, by remarkably reducing the kinds of basic circuits necessary for realizing all of $3^{3^2}=19683$ kinds of two-variable three-valued logic function circuits. In addition, the three-valued logic function circuit is capable of remarkably decreasing asymmetry of switching time of Start and End, by configuring all three-valued logic elements using only one-variable three-valued logic function circuits. Moreover, in the three-valued logic function circuit, since transfer gate logic is configured between control signals in the transfer gates formed of MOS (Metal Oxide Semiconductor) transistors, the number of logic function circuits necessary for controlling transfer gates is reduced, thereby remarkably reducing the number of transistors necessary for realizing all two-variable three-valued logic function circuits. The three-valued logic function circuit capable of improving the operation speed and the symmetry of waveform of the logic function circuit, by optimizing threshold voltages of the MOS transistors constituting the one-variable logic function circuits.

First, before describing this three-valued logic function circuit, Japanese Patent Application No. 2005-001866 previously filed by the present applicant will be schematically described to clarify the invention.

In previously filed Japanese Patent Application No. 2005-001866, the present applicant of the invention is to provide indication capable of systemically realizing a three-valued logic function circuit using only 17 kinds of one-variable three-valued logic function circuits, by remarkably reducing the kinds of basic circuits necessary for realizing all of $3^{3^2}=19683$ kinds of two-variable three-valued logic function circuits. Hereinafter, the invention according to the same application is referred to as the former invention, and the three-valued logic function circuit according to the invention is referred to as the former-invention three-valued logic function circuit.

Specifically, the former-invention three-valued logic function circuit includes three transfer gates T1, T2, and T3 formed of a p-type MOS transistor and an n-type MOS transistor, as shown in FIG. 1. That is, the former-invention three-valued logic function circuit has the three transfer gates T1, T2, and T3 turned on or off according to an input, and a value to be output from an output terminal Y is determined by turning on or off the three transfer gates T1, T2, and T3. Specifically, the former-invention three-valued logic function circuit is configured such that an output with respect to an input a=−1 is selected by the transfer gate T1, an output with respect to an input a=0 is selected by the transfer gate T2, and an output with respect to an input a=1 is selected by the transfer gate T3.

Two control terminals C-T1 and D-T1 of the transfer gate T1 are connected to a one-variable three-valued logic function circuit C1 that obtains an output (1, −1, −1) from an input a=(−1, 0, 1) and a one-variable three-valued logic function circuit D1 complementarily symmetric with the one-variable three-valued logic function circuit C1, respectively. Two control terminals C-T2 and D-T2 of the transfer gate T2 are connected to a one-variable three-valued logic function circuit C2 that obtains an output (−1, 1, −1) from an input a=(−1, 0, 1) and a one-variable three-valued logic function circuit D2 complementarily symmetric with the one-variable three-valued logic function circuit C2, respectively. Two control terminals C-T3 and D-T3 of the transfer gate T3 are connected to a one-variable three-valued logic function circuit C3 that obtains an output (−1, −1, 1) from an input a=(−1, 0, 1) and a one-variable three-valued logic function circuit D3 complementarily symmetric with the one-variable three-valued logic function circuit C3, respectively.

Input terminals of the transfer gates T1, T2, and T3 are connected to one-variable three-valued logic function circuits B1, B2, and B3 that obtain outputs from an input b, respectively, and output terminals Y-T1, Y-T2, and Y-T3 of the transfer gates T1, T2, and T3 are connected by Wired OR as an output terminal Y of the former-invention three-valued logic function circuit.

In the former-invention three-valued logic function circuit with such a configuration, to realize two-variable three-valued logic function circuit, one input b is input to three one-variable three-valued logic function circuits B1, B2, and B3, the outputs of the one-variable three-valued logic function circuits B1, B2, and B3 are input to the three transfer gates T1, T2, and T3 controlled on the basis of control signals generated according to the other input a, and the transfer gates T1, T2, and T3 are exclusively selected according to the input a, thereby obtaining a result of the two-variable three-valued logic function.

Accordingly, in the former-invention three-valued logic function circuit, since the control signals for transfer gates T1, T2, and T3 are obtained from the input a, three sets of six one-variable three-valued logic function circuits C1, D1, C2, D2, C3, and D3 are necessary.

The one-variable three-valued logic function circuits B1, B2, and B3 obtaining outputs from the input b, and the three sets of six one-variable three-valued logic function circuits C1, D1, C2, D2, C3, and D3 obtaining outputs from the input a are realized by the same method as the method disclosed in PCT Japanese Translation Patent Publication No. 2002-517937. In this case, although there are 27 kinds of one-variable three-valued logic functions, the former-invention three-valued logic function circuit can be systemically realized using only 17 kinds of one-variable three-valued logic function circuits.

The three-valued logic function circuit represented by the embodiment of the invention is a circuit obtained by improving the former-invention three-valued logic function circuit. That is, the former-invention three-valued logic function circuit is to provide indication capable of systemically realizing the three-valued logic function circuit using 17 kinds of one-variable three-valued logic function circuits and three MOS transfer gates, by remarkably decreasing the kinds of basic circuits necessary for realizing all two-variable three-valued logic function circuits, and it is possible to remarkably reduce asymmetry of the switching time of Start and End, by configuring all three-valued logic elements using only one-variable three-valued logic function circuits.

On the contrary, in the three-valued logic function circuit represented by the embodiment of the invention, the number of logic function circuits necessary for controlling the transfer gates is reduced from 6 to 4, by configuring transfer gate logic between control signals in three MOS transfer gates, and the number of transistors necessary for realizing all two-variable three-valued logic function circuits is remarkably reduced. In the method for realizing one-variable three-valued logic function circuits obtaining an output from the input a, the three-valued logic function circuit is to improve the operation speed and the symmetry of waveform of the logic function circuit, by optimizing threshold voltages of MOS transistors constituting the one-variable logic function circuits.

Hereinafter, such a three-valued logic function circuit will be described.

Figure 2:
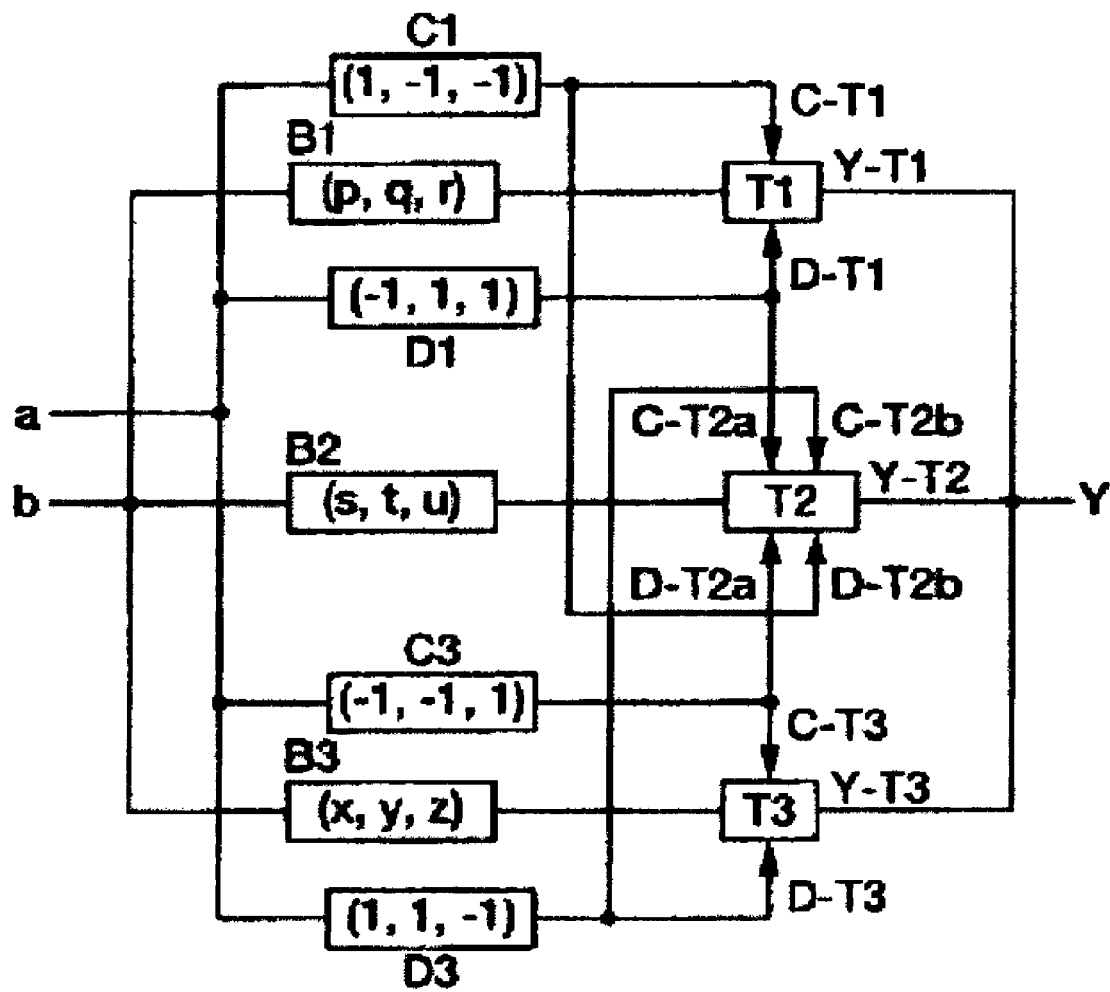
FIG. 2 is a diagram illustrating a configuration of a three-valued logic function circuit according to an embodiment of the invention.

As shown in FIG. 2, a three-valued logic function circuit has three transfer gates T1, T2, and T3 formed of a p-type MOS transistor and an n-type MOS transistor. That is, the three-valued logic function circuit has the three transfer gates T1, T2, and T3 turned on or off according to an input, similarly with the former-invention three-valued logic function circuit, and a value to be output from an output terminal Y is determined by turning on or off the three transfer gates T1, T2, and T3. Specifically, the three-valued logic function circuit is configured such that an output with respect to an input a=−1 is selected by the transfer gate T1, an output with respect to an input a=0 is selected by the transfer gate T2, and an output with respect to an input a=1 is selected by the transfer gate T3.

Two control terminals C-T1 and D-T1 of the transfer gate T1 are connected to a one-variable three-valued logic function circuit C1 that obtains an output (1, −1, −1) from an input a=(−1, 0, 1) and a one-variable three-valued logic function circuit D1 complementarily symmetric with the one-variable three-valued logic function circuit C1, respectively. Two control terminals C-T3 and D-T3 of the transfer gate T3 are connected to a one-variable three-valued logic function circuit C3 that obtains an output (−1, −1, 1) from an input a=(−1, 0, 1) and a one-variable three-valued logic function circuit D3 complementarily symmetric with the one-variable three-valued logic function circuit C3, respectively.

The transfer gate T2 has four control terminals C-T2a, C-T2b, D-T2a, and D-T2b. These four control terminals C-T2a, C-T2b, D-T2a, and D-T2b of the transfer gate T2 are connected to a one-variable three-valued logic function circuit D1, a one-variable three-valued logic function circuit D3, a one-variable three-valued logic function circuit C3, and a one-variable three-valued logic function circuit C1, respectively. That is, in the three-valued logic function circuit, an output of the one-variable three-valued logic function circuit C1 obtaining an output (1, −1, −1) from an input a=(−1, 0, 1) is connected to the control terminal D-T2b of the transfer gate T2 together with the control terminal C-T1 of the transfer gate T1, and an output of the one-variable three-valued logic function circuit D1 obtaining an output (−1, 1, 1) from the input a=(−1, 0, 1) is connected to the control terminal C-T2a of the transfer gate T2 together with the control terminal D-T1 of the transfer gate T1. In the three-valued logic function circuit, an output of the one-variable three-valued logic function circuit C3 obtaining an output (−1, −1, 1) from an input a=(−1, 0, 1) is connected to the control terminal D-T2a of the transfer gate T2 together with the control terminal C-T3 of the transfer gate T3, and an output of the one-variable three-valued logic function circuit D3 obtaining an output (1, 1, −1) from the input a=(−1, 0, 1) is connected to the control terminal C-T2b of the transfer gate T2 together with the control terminal D-T3 of the transfer gate T3.

Input terminals of the transfer gates T1, T2, and T3 are connected to one-variable three-valued logic function circuits B1, B2, and B3 obtaining an output from an input b, respectively, and output terminals Y-T1, Y-T2, and Y-T3 of the transfer gates T1, T2, and T3 are connected by Wired OR as an output terminal y of the three-valued logic function circuit.

Figure 3A:
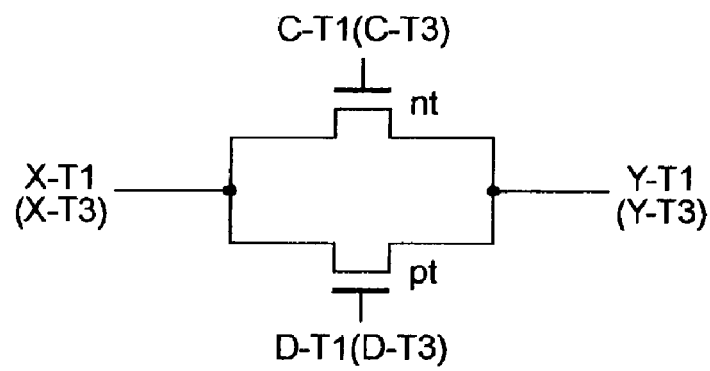
FIG. 3A is a diagram illustrating a configuration of a transfer gate of the three-valued logic function circuit, which illustrates a configuration of a transfer gates T1 or T3.

As shown in FIG. 3A, each of the transfer gates T1 and T3 of the transfer gates T1, T2, and T3 is configured by parallel connection of an enhancement n-type MOS transistor nt having a positive threshold voltage and an enhancement p-type MOS transistor pt having a negative threshold voltage. The n-type MOS transistor nt having the positive threshold voltage has a threshold voltage smaller than that of a normal enhancement transistor such as 0.2 volt. Also, the p-type MOS transistor pt having the negative threshold voltage has a threshold voltage smaller in absolute value than that of a normal enhancement transistor such as −0.2 volt. The control terminal C-T1 (C-T3) of the n-type MOS transistor nt is turned on by a control input 1, and is turned off by a control input −1. The control terminal D-T1 (D-T3) of the p-type MOS transistor pt, which is complementarily symmetric with the control terminal C-T1 (D-T1), is turned on by a control input −1, and is turned off by a control input 1.

Figure 3B:
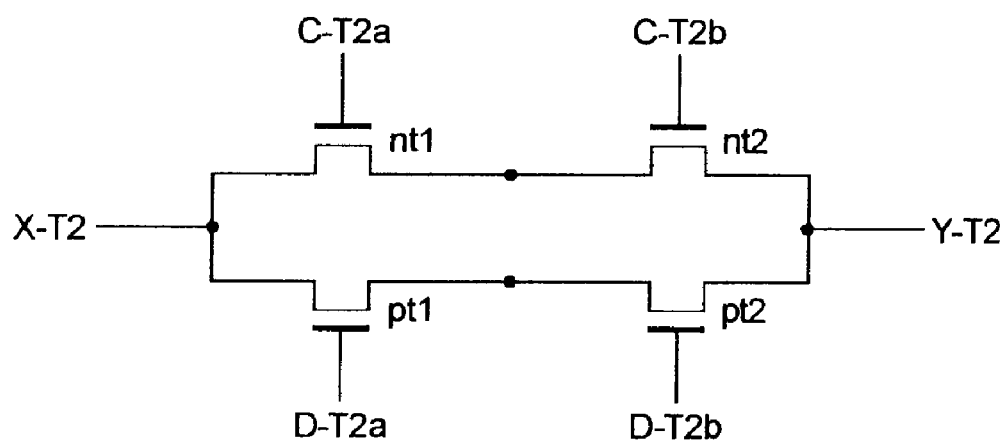
FIG. 3B is a diagram illustrating a configuration of a transfer gate of the three-valued logic function circuit, which illustrates a configuration of a transfer gates T2.

Meanwhile, as shown in FIG. 3B, the transfer gate T2 is configured by parallel connection of a switch pair serially connecting enhancement n-type MOS transistors nt1 and nt2 having a positive threshold voltage and a switch pair serially connecting enhancement p-type MOS transistor pt1 and pt2 having a negative threshold voltage. The enhancement n-type MOS transistors nt1 and nt2 having the positive threshold voltage has a threshold voltage smaller than that of a normal enhancement transistor such as 0.2 volt. Also, the enhancement p-type MOS transistors pt1 and pt2 having the negative threshold voltage has a threshold voltage smaller in absolute than that of a normal enhancement transistor such as −0.2 volt.

In such a transfer gate T2, the control terminal C-T2a is connected to the serial n-type MOS transistor nt1, and the control terminal C-T2b is connected to the n-type MOS transistor nt2. In addition, the control terminal D-T2a is connected to the serial p-type MOS transistor pt1, and the control terminal D-T2b is connected to the p-type MOS transistor pt2.

The control terminal C-T2a is connected to an output of the one-variable three-valued logic function circuit D1 obtaining an output (−1, 1, 1) from the input a=(−1, 0, 1), and the control terminal C-T2b is connected to an output of the one-variable three-valued logic function circuit D3 obtaining an output (1, 1, −1) from the input a=(−1, 0, 1). In the transfer gate T2, since the n-type MOS transistor nt1 as a switch controlled by the control terminal C-T2a and the n-type MOS transistor nt2 as a switch controlled by the control terminal C-T2b are connected to each other in series, they are equivalent to the control by (−1, 1, −1) that is a logical product (AND) of the control signal (−1, 1, 1) and the control signal (1, 1, −1). That is, the switch pair formed of the n-type MOS transistors nt1 and nt2 is turned on only in case of a control input 0, and is turned off in case of control inputs −1 and 1.

The control terminal D-T2a is connected to an output of the one-variable three-valued logic function circuit C3 obtaining an output (−1, −1, 1) from the input a=(−1, 0, 1), and the control terminal D-T2b is connected to an output of the one-variable three-valued logic function circuit C1 obtaining an output (1, −1, −1) from the input a=(−1, 0, 1). In the transfer gate T2, since the p-type MOS transistor pt1 as a switch controlled by the control terminal D-T2a and the p-type MOS transistor pt2 as a switch controlled by the control terminal D-T2b are connected to each other in series, they are equivalent to the control by (1, −1, 1) that is a negative logical product (NOR) of the control signal (−1, −1, 1) and the control signal (1, −1, −1). That is, the switch pair formed of the p-type MOS transistors pt1 and pt2 is turned on only in case of a control input 0, and is turned off in case of control inputs −1 and 1.

As described above, the transfer gate T2 performs operation of turning on only in case of the control input 0 and turning off in case of the control inputs −1 and 1.

In the three-valued logic function circuit, the one-variable three-valued logic function circuits B1, B2, and B3 provide (p, q, r), (s, t, u), and (x, y, z) from an input b=(−1, 0, 1), respectively. In this case, each of p, q, r, s, t, u, X, y, and z is taken from any one value of −1, 0, and 1. A two-variable three-valued logic function that can be realized by such a three-valued logic function circuit is given as shown in Table 1.

TABLE 1

Two-variable three-valued logic function

| | b | | |
|---|---|---|---|
| a | −1 | 0 | 1 |
| −1 | p | q | r |
| 0 | s | t | u |
| 1 | x | y | z |

The one-variable three-valued logic function-circuit is to realize any one of 27 kinds of one-variable three-valued logic functions shown in Table 2. First, the three-valued logic function circuits C1, D1, C3, and D3 connected to the control terminals C-T1, D-T1, C-T2a, C-T2b, D-T2a, D-T2b, C-T3, and D-T3 shown in FIG. 2 realize $f_{19}$, $f_{09}$, $f_{03}$, and $f_{25}$, respectively.

TABLE 2

One-variable three-valued logic function

| $f_{01}$ | $f_{02}$ | $f_{03}$ | $f_{04}$ | $f_{05}$ | $f_{06}$ | $f_{07}$ | $f_{08}$ | $f_{09}$ | $f_{10}$ | $f_{11}$ | $f_{12}$ | $f_{13}$ | $f_{14}$ |
|---|---|---|---|---|---|---|---|---|---|---|---|---|---|
| −1 | −1 | −1 | −1 | −1 | −1 | −1 | −1 | −1 | 0 | 0 | 0 | 0 | 0 |
| 0 | −1 | −1 | −1 | 0 | 0 | 0 | 1 | 1 | 1 | −1 | −1 | −1 | 0 |
| 1 | −1 | 0 | 1 | −1 | 0 | 1 | −1 | 0 | 1 | −1 | 0 | 1 | −1 |

| $f_{15}$ | $f_{16}$ | $f_{17}$ | $f_{18}$ | $f_{19}$ | $f_{20}$ | $f_{21}$ | $f_{22}$ | $f_{23}$ | $f_{24}$ | $f_{25}$ | $f_{26}$ | $f_{27}$ |
|---|---|---|---|---|---|---|---|---|---|---|---|---|
| −1 | 0 | 0 | 0 | 0 | 1 | 1 | 1 | 1 | 1 | 1 | 1 | 1 |
| 0 | 0 | 1 | 1 | 1 | −1 | −1 | −1 | 0 | 0 | 0 | 1 | 1 |
| 1 | 1 | −1 | 0 | 1 | −1 | 0 | 1 | −1 | 0 | 1 | −1 | 0 | 1 |

Among these one-variable three-valued logic functions, a function $f_{01}$ is identically $-1$, a function $f_{14}$ is identically 0, and a function $f_{27}$ is identically 1, and thus a specific circuit is not necessary.

Functions $f_{02}$ and $f_{26}$, functions $f_{03}$ and $f_{25}$, functions $f_{04}$ and $f_{24}$, functions $f_{05}$ and $f_{23}$, functions $f_{06}$ and $f_{22}$, functions $f_{07}$ and $f_{21}$, functions $f_{08}$ and $f_{20}$, functions $f_{09}$ and $f_{19}$, functions $f_{10}$ and $f_{18}$, functions $f_{11}$ and $f_{17}$, functions $f_{12}$ and $f_{16}$, and functions $f_{13}$ and $f_{15}$ are complementarily symmetric with each other, respectively. Among them, in the function $f_{06}$, $(-1, 0, 1)$ is an input and $(-1, 0, 1)$ is an output. That is, the function $f_{06}$ is Output=Input and Through. In the function $f_{22}$, $(-1, 0, 1)$ is an input and $(1, 0, -1)$ is an output. That is, the function $f_{22}$ is inversion of Input=Output, and thus corresponds to an inverter. Accordingly, the one-variable three-valued logic function circuits to be realized by the MOS transistors are 12 kinds of the functions $f_{15}$ to $f_{26}$. The functions $f_{02}$ to $f_{04}$ and the functions $f_{06}$ to $f_{13}$ can be realized by providing inverters at the rear ends of the functions $f_{26}$ to $f_{24}$ and the functions $f_{22}$ to $f_{15}$ complementarily symmetric with them. Also, they can be realized by simple circuits instead of the inverter $f_{22}$ in case of taking two values among three values $-1, 0, 1$ of the outputs, according to logic functions, which will be described later.

Next, a specific method for realizing these 12 kinds of one-variable three-valued logic function circuits will be described.

Figure 4A:
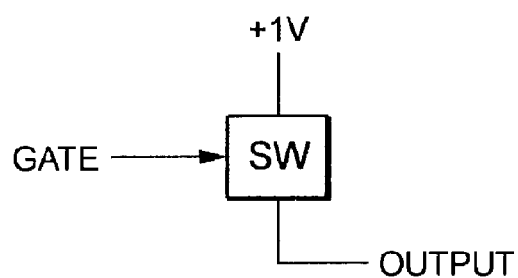
FIG. 4A is a diagram illustrating a configuration of a switch in the case that a source logic value is 1.
Figure 4B:
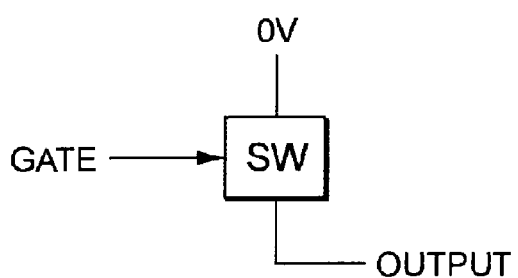
FIG. 4B is a diagram illustrating a configuration of a switch in the case that a source logic value is 0.
Figure 4C:
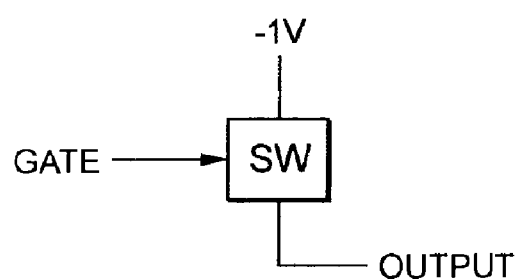
FIG. 4C is a diagram illustrating a configuration of a switch in the case that a source logic value is −1.

Three values are $(-1, 0, 1)$. A configuration is assumed in which there are three kinds of source logic values $-1, 0, 1$, and each switch is provide between an input terminal and an output terminal thereof as shown in FIGS. 4A to 4C. In addition, it is assumed that the logic value $-1$ is $-1$ volt, the logic value 0 is 0 volt, and the logic value 1 is $+1$ volt.

First, it is considered that the source logic value is $-1$.

Figure 5A:
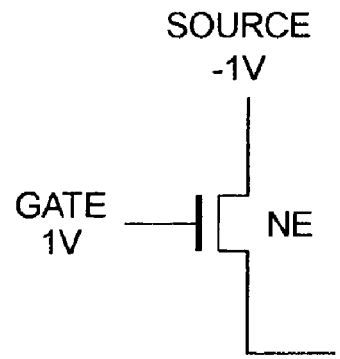
FIG. 5A is a diagram illustrating a configuration of an enhancement n-type MOS transistor having a threshold voltage of 1.5 V, which is turned on in the case where a source logic value is −1.

When a source electrode of a MOS transistor is connected to $-1$ volt and a gate voltage is $+1$ volt, a voltage $V_{gs}$ between gate and source becomes 2 volt. At this time, to turn on the MOS transistor, as shown in FIG. 5A, a threshold voltage may be made into 1.5 volt using an enhancement n-type MOS transistor. This enhancement n-type MOS transistor is abbreviated to NE.

Figure 5B:
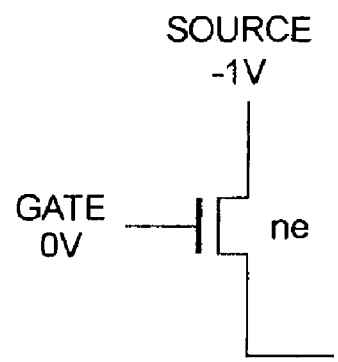
FIG. 5B is a diagram illustrating a configuration of an enhancement n-type MOS transistor having a threshold voltage of 0.5 V, which is turned on in the case where a source logic value is −1.

When a source electrode of a MOS transistor is connected to $-1$ volt and a gate voltage is 0 volt, a voltage $V_{gs}$ between gate and source becomes 1 volt. At this time, to turn on the MOS transistor, as shown in FIG. 5B, a threshold voltage may be made into 0.5 volt using an enhancement n-type MOS transistor. Since the threshold voltage is 0.5 volt, this switch is turned on in both cases of an input 0 ($V_{gs}$=1.0) and an input 1 ($V_{gs}$=20.0). This enhancement n-type MOS transistor is abbreviated to ne.

In short, these are shown in Table 3.

TABLE 3

Case that source logic value is $-1$

| Input | Vgs(V) | NE | ne |
|---|---|---|---|
| $-1$ | 0 | — | — |
| 0 | 1 | — | on |
| 1 | 2 | on | on |

Next, it is considered that the source logic is 1.

Figure 6A:
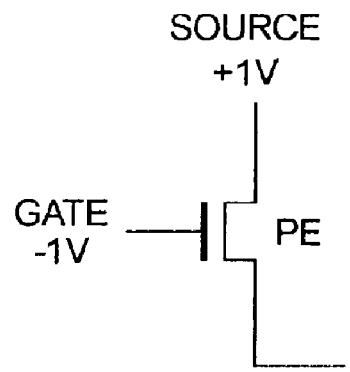
FIG. 6A is a diagram illustrating a configuration of an enhancement p-type MOS transistor having a threshold voltage of −1.5 V, which is turned on in the case where a source logic value is 1.

When a source electrode of a MOS transistor is connected to $+1$ volt and a gate voltage is $-1$ volt, a voltage $V_{gs}$ between gate and source becomes $-2$ volt. At this time, to turn on the MOS transistor, as shown in FIG. 6A, a threshold voltage may be made into $-1.5$ volt using an enhancement p-type MOS transistor. This enhancement p-type MOS transistor is abbreviated to PE.

Figure 6B:
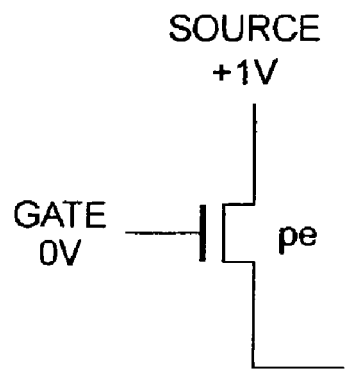
FIG. 6B is a diagram illustrating a configuration of an enhancement p-type MOS transistor having a threshold voltage of −0.5 V, which is turned on in the case where a source logic value is 1.

When a source electrode of a MOS transistor is connected to $+1$ volt and a gate voltage is 0 volt, a voltage $V_{gs}$ between gate and source becomes $-1$ volt. At this time, to turn on the MOS transistor, as shown in FIG. 6B, a threshold voltage may be made into $-0.5$ volt using an enhancement p-type MOS transistor. Since the threshold voltage is $-0.5$ volt, this switch is turned on in both cases of an input 0 ($V_{gs}$=$-1.0$) and an input 1 ($V_{gs}$=$-2.0$) This enhancement p-type MOS transistor is abbreviated to pe.

In short, these are shown in Table 4.

TABLE 4

Case that source logic value is 1

| Input | Vgs(V) | pe | PE |
|---|---|---|---|
| $-1$ | $-2$ | on | on |
| 0 | $-1$ | on | — |
| 1 | 0 | — | — |

Next, it is considered that the source logic value is 0.

Figure 7A:
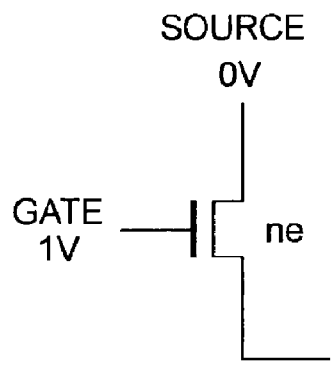
FIG. 7A is a diagram illustrating a configuration of an enhancement n-type MOS transistor having a threshold voltage of 0.5 V, which is turned on in the case where a source logic value is 0.

When a source electrode of a MOS transistor is connected to 0 volt and a gate voltage is $+1$ volt, a voltage $V_{gs}$ between gate and source becomes 1 volt. At this time, to turn on the MOS transistor, as shown in FIG. 7A, a threshold voltage may be made into 0.5 volt using an enhancement n-type MOS transistor. This enhancement n-type MOS transistor is the enhancement n-type MOS transistor ne defined using FIG. 5B.

Figure 7B:
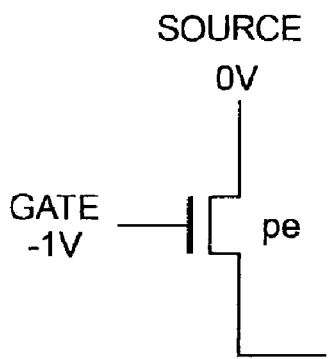
FIG. 7B is a diagram illustrating a configuration of an enhancement p-type MOS transistor having a threshold voltage of −0.5 V, which is turned on in the case where a source logic value is 0.

When a source electrode of a MOS transistor is connected to 0 volt and a gate voltage is $-1$ volt, a voltage $V_{gs}$ between gate and source becomes $-1$ volt. At this time, to turn on the MOS transistor, as shown in FIG. 7B, a threshold voltage may be made into $-0.5$ volt using an enhancement p-type MOS transistor. This enhancement p-type MOS transistor is the enhancement p-type MOS transistor pe defined using FIG. 6B.

Figure 7C:
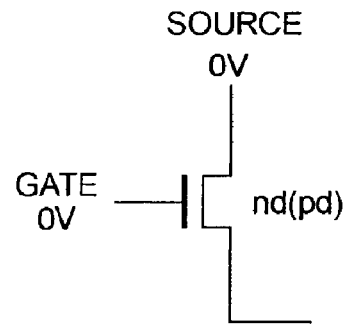
FIG. 7C is a diagram illustrating a configuration of a depletion enhancement n-type MOS transistor or p-type MOS transistor having a threshold voltage of −0.5 V or 0.5 V, which is turned on in the case where a source logic value is 0.

When a source electrode of a MOS transistor is connected to 0 volt and a gate voltage is 0 volt, a voltage $V_{gs}$ between gate and source becomes 0 volt. At this time, to turn on the MOS transistor, as shown in FIG. 7C, a threshold voltage may be made into $-0.5$ volt (or $+0.5$ volt) using a depletion n-type MOS transistor (or p-type MOS transistor). This depletion n-type MOS transistor (or p-type MOS transistor) is abbreviated to nd (pd).

In the case of using the depletion n-type MOS transistor nd, the switch is turned on in both cases of an input 0 ($V_{gs}$=0.0) and an input 1 ($V_{gs}$=1.0). In the case of using the depletion p-type MOS transistor pd, the switch is turned on in both cases of an input 0 ($V_{gs}$=0.0) and an input $-1$ ($V_{gs}$=$-1.0$).

In short, these are shown in Table 5.

TABLE 5

Case that source logic value is 0

| Input | Vgs (V) | ne0 | nd | pd | pe0 |
|---|---|---|---|---|---|
| $-1$ | $-1$ | — | — | on | on |
| 0 | 0 | — | on | on | — |
| 1 | 1 | on | on | — | — |

Figure 8:
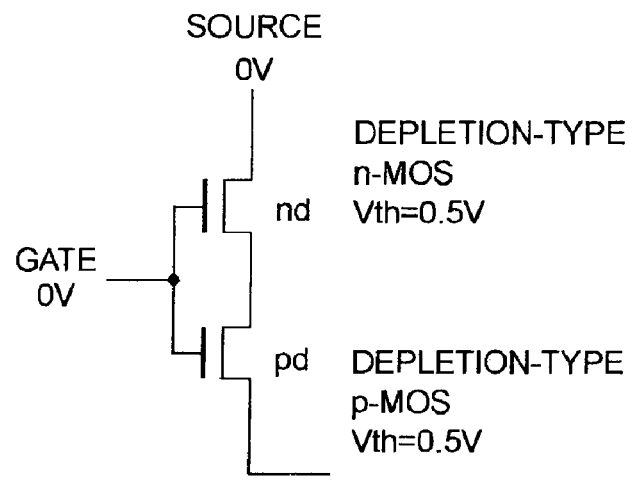
FIG. 8 is a diagram illustrating a configuration of outputting an output 0 only in case of an input 0.

From Table 5, when the source logic value is 0, it can be known that the depletion n-type MOS transistor nd and the depletion p-type MOS transistor pd may be connected in series and inserted between an input terminal and an output terminal in which the source logic value is 0, as shown in Table 6 and FIG. 8, as a circuit of outputting an output 0 only in case of an input 0.

TABLE 6

Serial connection of nd and pd

| Input | Vgs(V) | nd | pd | nd-pd |
|---|---|---|---|---|
| −1 | −1 | — | on | — |
| 0 | 0 | on | on | on |
| 1 | 1 | on | — | — |

Figure 9:
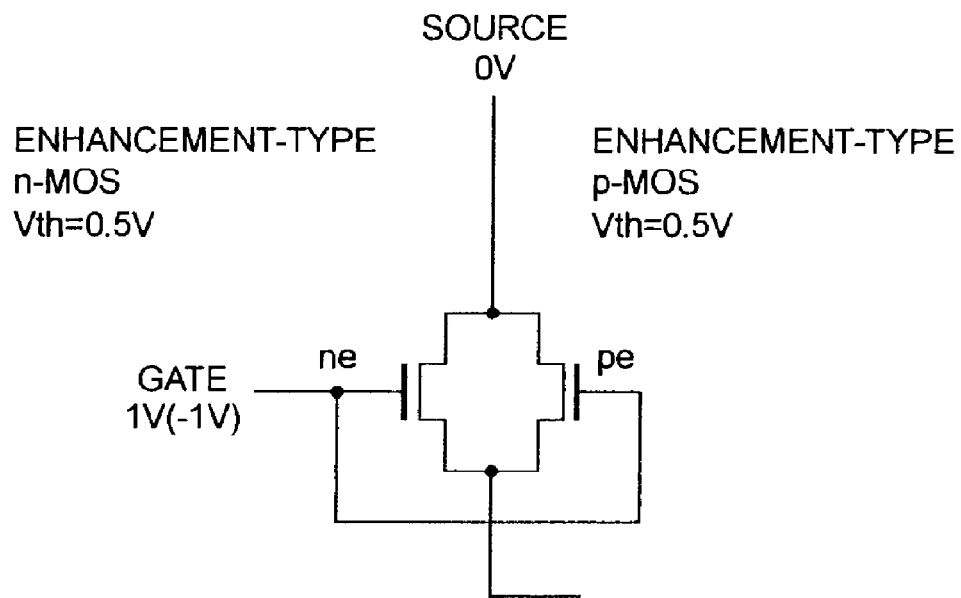
FIG. 9 is a diagram illustrating a configuration of outputting an output 0 in either case of an input −1 or 1.

In addition, from Table 5, when the source logic value is 0, it can be known that the enhancement n-type MOS transistor ne and the enhancement p-type MOS transistor pe may be connected in parallel and inserted between an input terminal and an output terminal in which the source logic value is 0, as shown in Table 7 and FIG. 9, as a circuit of outputting an output 0 in any case of inputs −1, and 1.

TABLE 7

Parallel connection of ne and pe

| Input | Vgs(V) | ne0 | pe0 | ne0//pe0 |
|---|---|---|---|---|
| −1 | −1 | — | on | on |
| 0 | 0 | — | — | — |
| 1 | 1 | on | — | on |

Hereinafter, connection of a back gate electrode (base bias) of a MOS transistor in such a circuit will be described.

Generally, a back gate electrode is connected to a power source. This method may be applied to the n-type MOS transistors NE, ne, and nt connected to a power source for supplying a negative voltage, and the p-type MOS transistors PE, pe, and pt for supplying a positive voltage. However, when a back gate electrode of the MOS transistors nd, nt, ne, pd, pt, and pe using 0 volt as a power source is connected to a power source of 0 volt and a voltage of an output terminal is positive or negative, large current flows through a junction diode formed between the back gate electrode and a drain electrode. For example, with respect to the n-type MOS transistors nd, nt, and ne, when an output terminal voltage is negative, reversion of a source voltage and a drain voltage occurs, and thus forward current flows through PN junction formed between the back gate electrode and the drain electrode. With respect to the p-type MOS transistors pd, pt, and pe, when an output terminal voltage is positive, reversion of a source voltage and a drain voltage occurs, and thus forward current flows through PN junction formed among the source electrode, the back gate electrode, and the drain electrode.

To prevent such a phenomenon, even in case of the MOS transistor connected to a power source of 0 volt, the n-type MOS transistor is connected to a power source for supplying a negative voltage, and the p-type MOS transistor is connected to a power source for supplying a positive voltage. Accordingly, even when the output terminal voltage is positive or negative, it is prevented that the forward current flows through the PN junction formed between the back gate electrode and the drain electrode.

Therefore, in the three-valued logic function circuit, the back gate electrode of the enhancement n-type MOS transistor nt constituting the transfer gates T1 and T3 is connected to the power source for supplying a negative voltage, and the back gate electrode of the enhancement p-type MOS transistor pt is connected to the power source for supplying a positive voltage. Similarly, in the three-valued logic function circuit, the back gate electrodes of the enhancement n-type MOS transistors nt1 and nt2 constituting the transfer gate T2 are connected to the power source for supplying a negative voltage, and the back gate electrodes of the enhancement p-type MOS transistors pt1 and pt2 are connected to the power source for supplying a positive voltage.

Then, the 27 kinds of one-variable three-valued logic functions shown in Table 2 are classified as follows.

In Table 2, the case that can be realized by a one-stage CMOS (Complementary MOS) circuit is only case that a logic function f(x) is in a relation of $f(-1) \geqq f(0) \geqq f(1)$ with respect to an input x. Hereinafter, such a function is referred to as an inverse function (reverse function). That is, in the inverse function, a large-and-small relation of the input x and a large-and-small relation of the function f(x) are reversed. The functions $f_{10}$, $f_{13}$, $f_{19}$, $f_{22}$, $f_{23}$, $f_{25}$, and $f_{26}$ among the 27 kinds of one-variable three-valued logic functions shown in Table 2 are the inverse function. These are Class 1.

The functions $f_{02}$ to $f_{05}$, the functions $f_{07}$ to $f_{09}$, the functions $f_{15}$ to $f_{18}$, the functions $f_{20}$, $f_{21}$, and $f_{24}$ among the 27 kinds of one-variable three-valued logic functions are not the inverse function. Accordingly, they cannot be realized by a one-stage CMOS circuit. The functions $f_{02}$ to $f_{05}$ and the functions $f_{07}$ to $f_{09}$ among the one-variable three-valued logic functions are complementarily symmetric with the functions $f_{26}$ to $f_{23}$ and The functions $f_{21}$ to $f_{19}$, respectively. Principally, the functions $f_{26}$ to $f_{19}$ are realized, and then an inverter $f_{22}$ may be provided at the rear end thereof. These are Class 2.

The function $f_{15}$ is complementarily symmetric with the inverse function $f_{13}$, and the function $f_{19}$ is complementarily symmetric with the function $f_{10}$. Accordingly, the inverse function $f_{23}$ may be provided at the rear end of each of the inverse functions $f_{13}$ and $f_{10}$. These are also Class 2.

The functions $f_{11}$ and $f_{17}$ and the functions $f_{12}$ and $f_{16}$ among the 27 kinds of one-variable three-valued logic functions shown in Table 2 are complementarily symmetric with each other, but are not the inverse function. Accordingly, they cannot be realized by a one-stage CMOS circuit. In the present embodiment, each of the functions $f_{11}$ and $f_{12}$ may be realized by a two-stage CMOS circuit. These are Class 3.

The functions $f_{17}$ and $f_{16}$ may be realized by providing an inverter at the rear end of each of the functions $f_{11}$ and $f_{12}$. However, in this case, a three-stage CMOS circuit is formed. Thus, in consideration of the complementary symmetry of the functions $f_{11}$ and $f_{17}$ and the functions $f_{12}$ and $f_{16}$, they can be realized by a direct two-stage CMOS circuit. These are Class 3'.

The other functions $f_{20}$, $f_{21}$, and $f_{24}$ are not the inverse function, and thus can be realized by a two-stage CMOS circuit. These are also Class 3. The functions $f_{08}$, $f_{07}$, and $f_{04}$ are complementarily symmetric with the functions $f_{20}$, $f_{21}$, and $f_{24}$, respectively. Accordingly, they can be realized also by a direct two-stage CMOS circuit. These are also Class 3'.

As described above, circuits to be realized is total 12 kinds of the seven kinds of the inverse circuits $f_{10}$, $f_{13}$, $f_{19}$, $f_{22}$, $f_{23}$, $f_{25}$, and $f_{26}$ classified into Class 1, and the five kinds of circuits $f_{11}$, $f_{12}$, $f_{20}$, $f_{21}$, and $f_{24}$ classified into Class 3, which are not the inverse circuits. In addition, there may be realized total 17 kinds obtained by adding five kinds of functions $f_{04}$, $f_{07}$, $f_{08}$, $f_{16}$, and $f_{17}$ classified into Class 3' that can be realized by the direct two-stage CMOS circuit from complementary symmetry, in addition to these 12 kinds of circuits.

The others among the functions $f_{02}$ to $f_{09}$ classified into Class 2 are the functions $f_{02}$, $f_{03}$, $f_{05}$, and $f_{09}$. Among them, the function $f_{02}=(-1, -1, 0)$ can be realized by providing the inverter $f_{13}$ (0, 0, −1) at the rear end of the function $f_{26}$=(1, 1, 0). The function $f_{03}$=(−1, −1, 1) can be realized by providing the inverter $f_{19}$ (1, −1, −1) at the rear end of the function $f_{25}$=(1, 1, −1). The function $f_{05}$=(−1, 0, 0) can be realized by providing the inverter $f_{13}$ (0, 0, −1) at the rear end of the function $f_{23}$=(1, 0, 0). In addition, the function $f_{09}$=(−1, 1, 1) can be realized by providing the inverter $f_{25}$ (1, 1, −1) at the rear end of the function $f_{19}$=(1, −1, −1).

There are six kinds of methods for realizing these functions $f_{02}$, $f_{03}$, $f_{05}$, and $f_{09}$, respectively. Except the use of the most general inverter $f_{22}$ (1, 0, −1), there are four kinds of methods. For example, in the function $f_{03}$, the function $f_{25}$=(1, 1, −1) may be used as the inverter provided at the rear end thereof. In the circuit described in PCT Japanese Translation Patent Publication No. 2002-517937, the function $f_{25}$=(1, 1, −1) or the function $f_{19}$=(1, −1, −1) is commonly used as the former-stage element.

In short, Table 8 is obtained.

TABLE 8

Classification according to method of realizing one-variable three-valued logic function

| | $f_{01}$ | $f_{02}$ | $f_{03}$ | $f_{04}$ | $f_{05}$ | $f_{06}$ | $f_{07}$ | $f_{08}$ | $f_{09}$ | $f_{10}$ | $f_{11}$ | $f_{12}$ | $f_{13}$ | $f_{14}$ |
|---|---|---|---|---|---|---|---|---|---|---|---|---|---|---|
| | −1 | −1 | −1 | −1 | −1 | −1 | −1 | −1 | −1 | −1 | 0 | 0 | 0 | 0 | 0 |
| | 0 | −1 | −1 | −1 | 0 | 0 | 0 | 1 | 1 | 1 | −1 | −1 | −1 | 0 | 0 |
| | 1 | −1 | 0 | 1 | −1 | 0 | 1 | −1 | 0 | 1 | −1 | 0 | 1 | −1 | 0 |

| | c | ¬$f_{26}$ | ¬$f_{25}$ | ¬$f_{24}$ | ¬$f_{23}$ | x | ¬$f_{21}$ | ¬$f_{20}$ | ¬$f_{19}$ | ¬$f_{18}$ | ¬$f_{17}$ | ¬$f_{16}$ | ¬$f_{15}$ | c |
|---|---|---|---|---|---|---|---|---|---|---|---|---|---|---|
| Class | — | (2) | (2) | (3') | (2) | — | (3') | (3') | (2) | (1) | (3) | (3) | (1) | — |

| | $f_{15}$ | $f_{16}$ | $f_{17}$ | $f_{18}$ | $f_{19}$ | $f_{20}$ | $f_{21}$ | $f_{22}$ | $f_{23}$ | $f_{24}$ | $f_{25}$ | $f_{26}$ | $f_{27}$ |
|---|---|---|---|---|---|---|---|---|---|---|---|---|---|
| | −1 | 0 | 0 | 0 | 0 | 1 | 1 | 1 | 1 | 1 | 1 | 1 | 1 |
| | 0 | 0 | 1 | 1 | −1 | −1 | −1 | 0 | 0 | 0 | 1 | 1 | 1 |
| | 1 | 1 | −1 | 0 | 1 | −1 | 0 | 1 | −1 | 0 | 1 | −1 | 0 | 1 |

| | ¬$f_{13}$ | ¬$f_{12}$ | ¬$f_{11}$ | ¬$f_{10}$ | ¬$f_{09}$ | ¬$f_{08}$ | ¬$f_{07}$ | ¬$f_{06}$ | ¬$f_{05}$ | ¬$f_{04}$ | ¬$f_{03}$ | ¬$f_{02}$ | c |
|---|---|---|---|---|---|---|---|---|---|---|---|---|---|
| Class | (2) | (3') | (3') | (2) | (1) | (3) | (3) | (1) | (1) | (3) | (1) | (1) | — |

The functions classified as shown above can be realized as follows.

First, the method for realizing the seven kinds of inverse functions $f_{10}$, $f_{13}$, $f_{19}$, $f_{22}$, $f_{23}$, $f_{25}$, and $f_{26}$ classified into Class 1, which can be realized by a one-stage CMOS circuit will be described.

Figure 10:
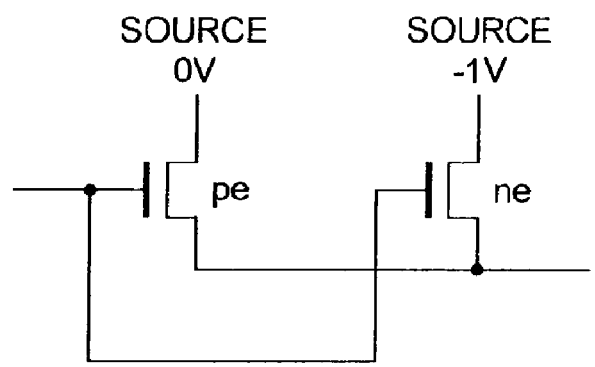
FIG. 10 is a diagram illustrating a circuit configuration for realizing a function $f_{10}$.

In the function $f_{10}$, (−1, 0, 1) is an input, and (0, −1, −1) is an output. Accordingly, as shown in FIG. 10, the function $f_{10}$ can be realized by operating the enhancement p-type MOS transistor pe by an input b, so as to turn on in case of the input −1 with respect to a source logic value 0, and by operating the enhancement n-type MOS transistor ne by an input b, so as to turn on in case of the inputs 0 and 1 with respect to a source logic value −1.

Figure 11:
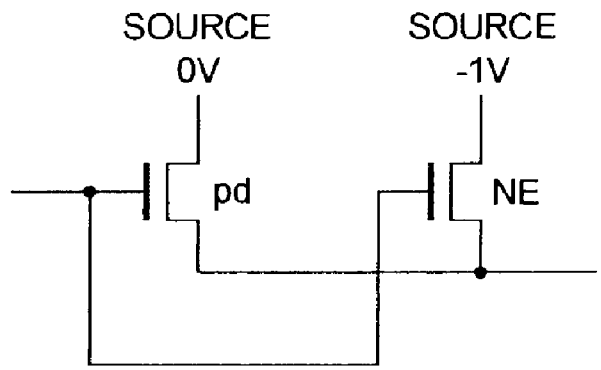
FIG. 11 is a diagram illustrating a circuit configuration for realizing a function $f_{13}$.

In the function $f_{13}$, (−1, 0, 1) is an input, and (0, 0, −1) is an output. Accordingly, as shown in FIG. 11, the function $f_{13}$ can be realized by operating the depletion p-type MOS transistor pd by an input b, so as to turn on in case of the inputs −1 and 0 with respect to a source logic value 0, and by operating the enhancement n-type MOS transistor NE by an input b, so as to turn on in case of the input 1 with respect to a source logic value −1.

Figure 12:
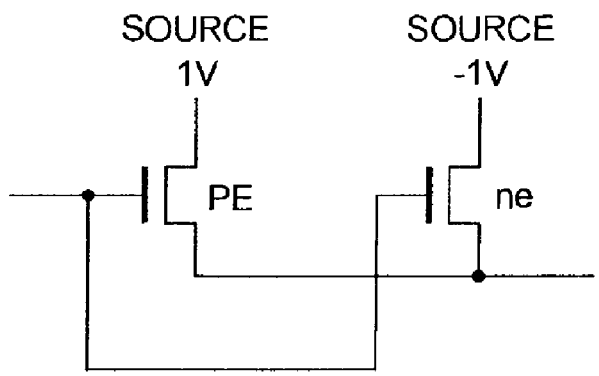
FIG. 12 is a diagram illustrating a circuit configuration for realizing a function $f_{19}$.

In the function $f_{19}$, (−1, 0, 1) is an input, and (1, −1, −1) is an output. Accordingly, as shown in FIG. 12, the function $f_{19}$ can be realized by operating the enhancement p-type MOS transistor PE by an input b, so as to turn on in case of the input −1 with respect to a source logic value 1, and by operating the enhancement n-type MOS transistor ne by an input b, so as to turn on in case of the inputs 0 and 1 with respect to a source logic value −1.

Figure 13:
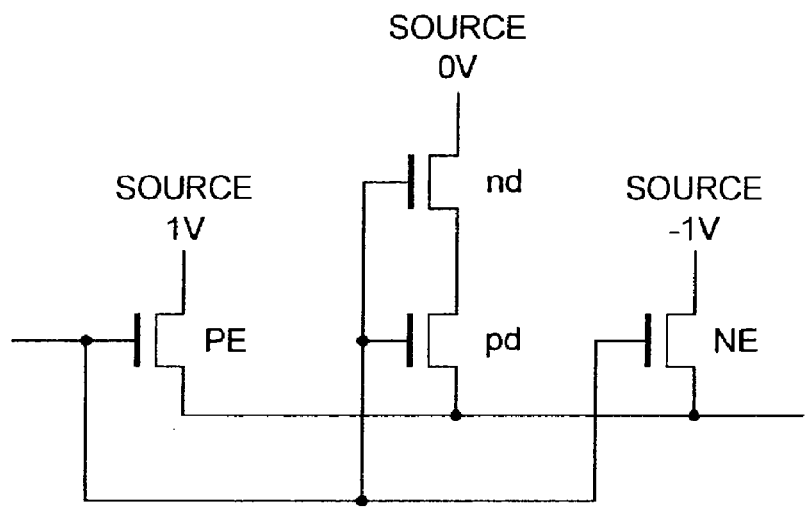
FIG. 13 is a diagram illustrating a circuit configuration for realizing a function $f_{22}$.

In the function $f_{22}$, (−1, 0, 1) is an input, and (1, 0, −1) is an output. Accordingly, as shown in FIG. 13, the function $f_{22}$ can be realized by operating the enhancement p-type MOS transistor PE by an input b, so as to turn on in case of the input −1 with respect to a source logic value 1, by operating a serial circuit of the depletion n-type MOS transistor nd and the depletion p-type MOS transistor pd by an input b, so as to turn on in case of the input 0 with respect to a source logic value 0, and by operating the enhancement n-type MOS transistor NE by an input b, so as to turn on in case of the input 1 with respect to a source logic value −1.

Figure 14:
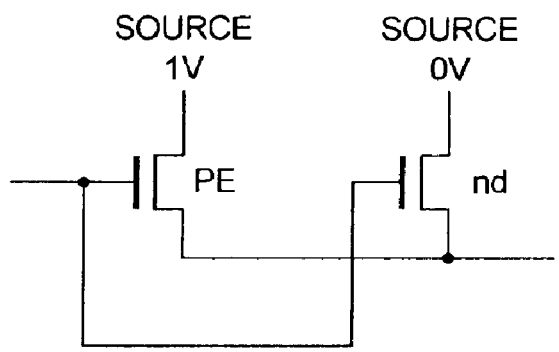
FIG. 14 is a diagram illustrating a circuit configuration for realizing a function $f_{23}$.

In the function $f_{23}$, (−1, 0, 1) is an input, and (1, 0, 0) is an output. Accordingly, as shown in FIG. 14, the function $f_{23}$ can be realized by operating the enhancement p-type MOS transistor PE by an input b, so as to turn on in case of the input −1 with respect to a source logic value 1, and by operating the depletion n-type MOS transistor nd by an input b, so as to turn on in case of the inputs 0 and 1 with respect to a source logic value 0.

Figure 15:
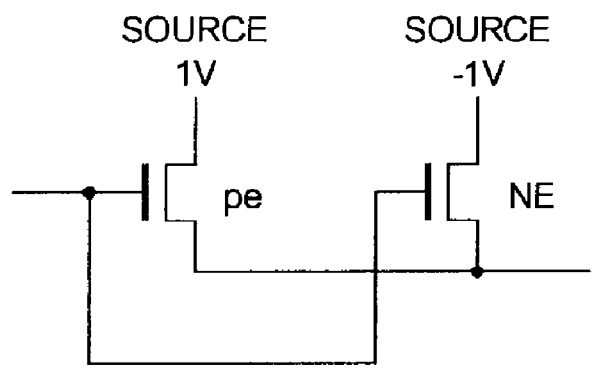
FIG. 15 is a diagram illustrating a circuit configuration for realizing a function $f_{25}$.

In the function $f_{25}$, (−1, 0, 1) is an input, and (1, 1, −1) is an output. Accordingly, as shown in FIG. 15, the function $f_{25}$ can be realized by operating the enhancement p-type MOS transistor pe by an input b, so as to turn on in case of the inputs −1 and 0 with respect to a source logic value 1, and by operating the enhancement n-type MOS transistor NE by an input b, so as to turn on in case of the input 1 with respect to a source logic value −1.

Figure 16:
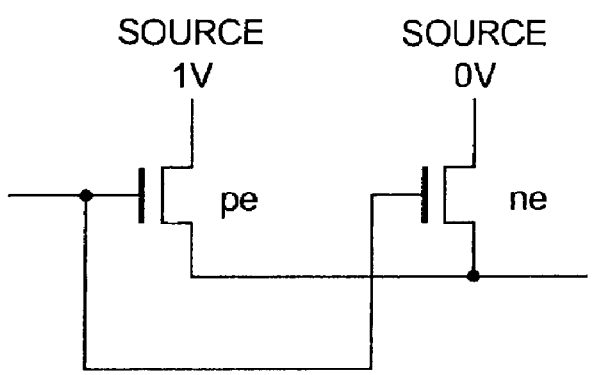
FIG. 16 is a diagram illustrating a circuit configuration for realizing a function $f_{26}$.

In the function $f_{26}$, (−1, 0, 1) is an input, and (1, 1, 0) is an output. Accordingly, as shown in FIG. 16, the function $f_{26}$ can be realized by operating the enhancement p-type MOS transistor pe by an input b, so as to turn on in case of the inputs −1 and 0 with respect to a source logic value 1, and by operating the enhancement n-type MOS transistor ne by an input b, so as to turn on in case of the input 1 with respect to a source logic value 0.

As described above, the seven kinds of inverse functions $f_{10}$, $f_{13}$, $f_{19}$, $f_{22}$, $f_{23}$, $f_{25}$, and $f_{26}$ classified into Class 1 can be realized by a one-stage CMOS circuit.

Next, the method for realizing the five kinds of functions $f_{11}$, $f_{12}$, $f_{20}$, $f_{21}$, and $f_{24}$ classified into Class 3, which cannot be realized by a one-stage CMOS circuit will be described. These functions $f_{11}$, $f_{12}$, $f_{20}$, $f_{21}$, and $f_{24}$ need the additional circuit $f_{25}$, which converts the input (−1, 0, 1) into a two-value (1, 1, −1), on the input side thereof, and become two-stage CMOS circuits. Hereinafter, the enhancement n-type MOS transistor nt and p-type MOS transistor pt denote an enhancement MOS transistor having threshold voltages smaller in absolute value than a normal threshold voltage, for example, the threshold voltages thereof are 0.2 volt and −0.2 volt, respectively.

Figure 17:
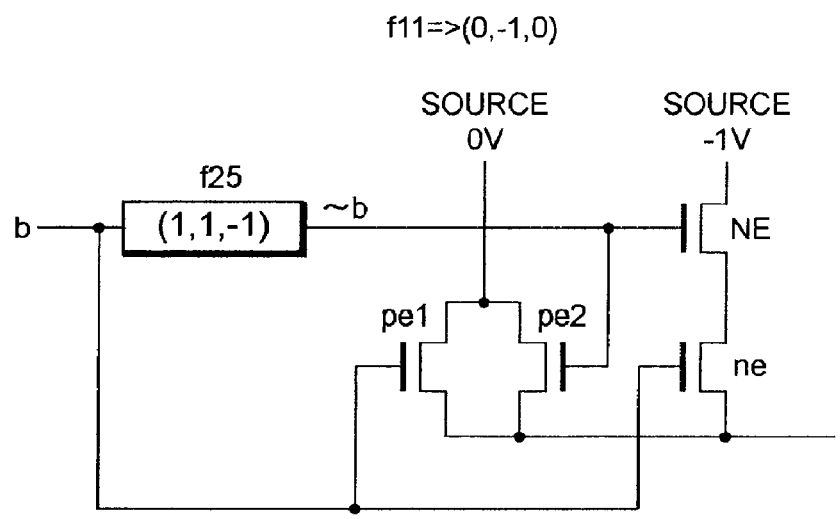
FIG. 17 is a diagram illustrating a circuit configuration for realizing a function $f_{11}$.

In the function $f_{11}$, (−1, 0, 1) is an input, and (0, −1, 0) is an output. Accordingly, as shown in FIG. 17, the function $f_{11}$, in which an input b passes through the inverse function $f_{25}$=(1, 1, −1) to invert the output to ¬b, is configured by inserting a parallel circuit of two enhancement p-type MOS transistors pe to operate one p-type MOS transistor pe1 by an input b and to operate the other p-type MOS transistor pe2 by the inverse output ¬b of the input b, so as to turn on in case of the inputs −1 and 1 with respect to a source logic value 0. The function $f_{11}$ can be realized by inserting a serial circuit of two enhancement n-type MOS transistors ne and NE to operate one n-type MOS transistor ne by an input b and to operate the other n-type MOS transistor NE by the inverse output ¬b of the input b, so as to turn on in case of the input 0 with respect to a source logic value −1. The operation of the function $f_{11}$ is shown in Table 9.

TABLE 9

Operation non-inverse function f11

| | | | | | 0 | | | −1 | | |
|---|---|---|---|---|---|---|---|---|---|---|
| b | −1 | 0 | 1 | pe1 | on | — | — | ne | — | on | on |
| ¬b | 1 | 1 | −1 | pe2 | — | — | on | NE | on | on | — |
| y | | | | pe1//pe2 | on | — | on | ne · NE | — | on | — |

Figure 18:
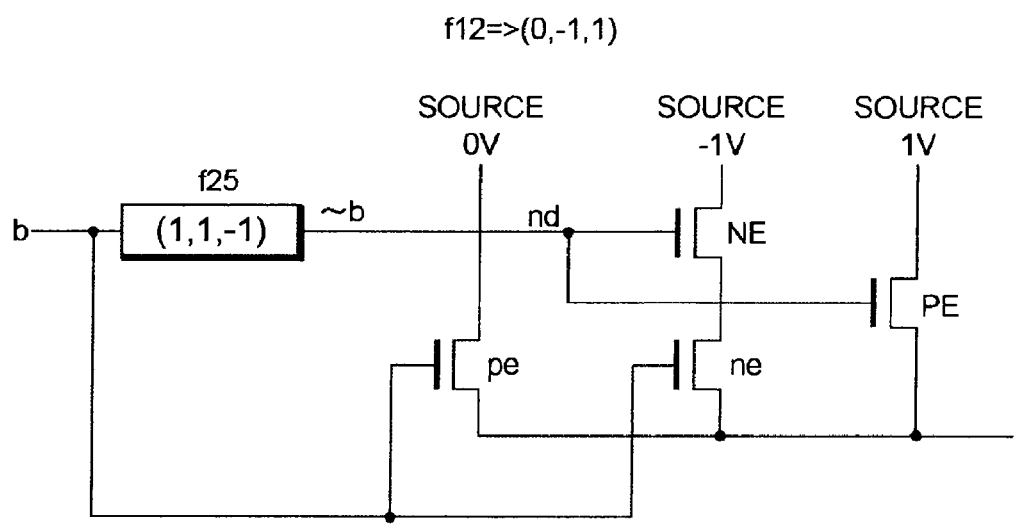
FIG. 18 is a diagram illustrating a circuit configuration for realizing a function $f_{12}$.

In the function $f_{12}$, (−1, 0, 1) is an input, and (0, −1, 1) is an output. Accordingly, as shown in FIG. 18, the function $f_{12}$, in which an input b passes through the inverse function $f_{25}$=(1, 1, −1) to invert the output to ¬b, is configured to operate the enhancement p-type MOS transistor pe by an input b, so as to turn on in case of the input −1 with respect to a source logic value 0. The function $f_{12}$ is configured by inserting a serial circuit of two enhancement n-type MOS transistors ne and NE to operate one n-type MOS transistor ne by an input b and to operate the other n-type MOS transistor NE by the inverse output ¬b of the input b, so as to turn on in case of the input 0 with respect to a source logic value −1. The function $f_{12}$ can be realized by operating the enhancement p-type MOS transistor PE by the inverse output ¬b of the input b, so as to turn on in case of the input 1 with respect to a source logic value 1. The operation of the function $f_{12}$ is shown in Table 10.

TABLE 10

Operation non-inverse function f12

| | | | | | 0 | | | −1 | | | 1 | | |
|---|---|---|---|---|---|---|---|---|---|---|---|---|---|
| b | −1 | 0 | 1 | pe | on | — | — | ne | — | on | on | | | |
| ¬b | 1 | 1 | −1 | | | | | NE | on | on | — | PE | — | — | on |
| y | | | | pe | on | — | — | ne · NE | — | on | | PE | — | — | on |

Figure 19:
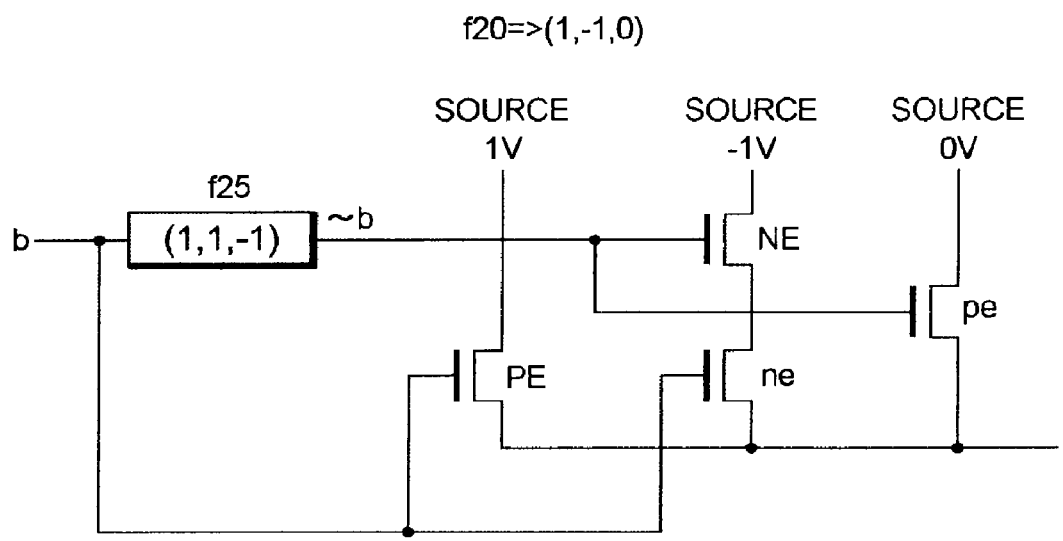
FIG. 19 is a diagram illustrating a circuit configuration for realizing a function $f_{20}$.

In the function $f_{20}$, (−1, 0, 1) is an input, and (1, −1, 0) is an output. Accordingly, as shown in FIG. 19, the function $f_{20}$ in which an input b passes through the inverse function $f_{25}$=(, 1, −1) to invert the output to ¬b, is configured to operate the enhancement p-type MOS transistor PE by an input b, so as to turn on in case of the input −1 with respect to a source logic value 1. The function $f_{20}$ is configured by inserting a serial circuit of two enhancement n-type MOS transistors ne and NE to operate one n-type MOS transistor ne by an input b and to operate the other n-type MOS transistor NE by the inverse output ¬b of the input b, so as to turn on in case of the input 0 with respect to a source logic value −1. The function $f_{20}$ can be realized by operating the enhancement p-type MOS transistor pe by the inverse output ¬b of the input b, so as to turn on in case of the input 1 with respect to a source logic value 0. The operation of the function $f_{20}$ is shown in Table 11.

TABLE 11

Operation non-inverse function f20

| | | | | | 1 | | | −1 | | | 0 | | |
|---|---|---|---|---|---|---|---|---|---|---|---|---|---|
| b | −1 | 0 | 1 | PE | on | — | — | ne | — | on | on | | | |
| ¬b | 1 | 1 | −1 | | | | | NE | on | on | — | pe | — | — | on |
| y | | | | PE | on | — | — | ne · NE | — | on | | pe | — | — | on |

In this case, although the normal enhancement p-type MOS transistor pe is used as the enhancement p-type MOS transistor connected to the source logic value 0, the applicant of the invention confirmed that characteristics of the operation speed or the symmetry of waveform are improved by using the enhancement p-type MOS transistor pt having a negative threshold voltage smaller in absolute value than a threshold voltage of the p-type MOS transistor pe, in stead of the normal enhancement p-type MOS transistor pe. That is, in the function $f_{20}$, although the normal enhancement p-type transistor pe may be used as the enhancement p-type MOS transistor connected to the source logic value 0, it is possible to improve the operation speed and the symmetry of waveform of the three-valued logic function circuit by using the enhancement p-type MOS transistor pt having the negative threshold voltage smaller in absolute value than the normal threshold voltage.

Figure 20:
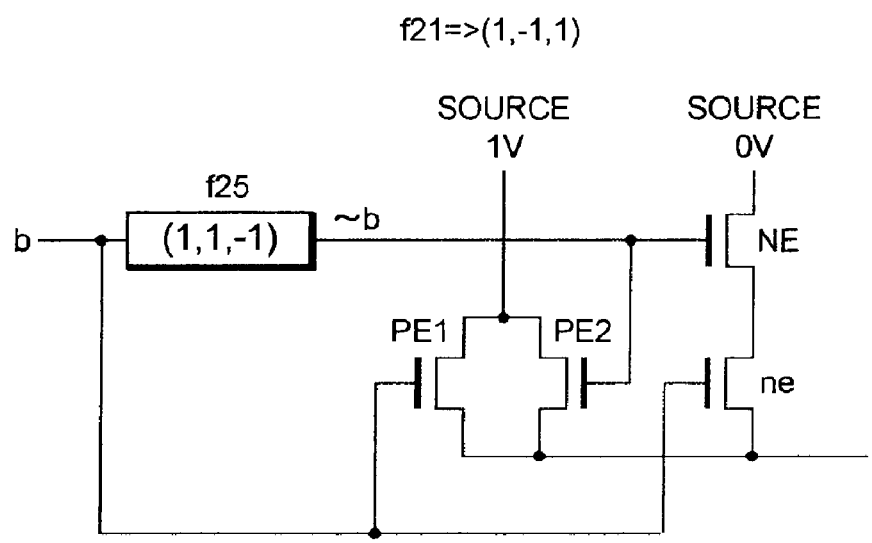
FIG. 20 is a diagram illustrating a circuit configuration for realizing a function $f_{21}$.

In the function $f_{21}$, (−1, 0, 1) is an input, and (1, −1, 1) is an output. Accordingly, as shown in FIG. 20, the function $f_{21}$, in which an input b passes through the inverse function $f_{25}$=(1, 1, −1) to invert the output to ¬b, is configured by inserting a parallel circuit of two enhancement p-type MOS transistors PE to operate one p-type MOS transistor PE1 by an input b and to operate the other p-type MOS transistor PE2 by the inverse output ¬b of the input b, so as to turn on in case of the inputs −1 and 1 with respect to a source logic value 1. The function $f_{21}$ can be realized by inserting a serial circuit of two enhancement n-type MOS transistors ne and NE to operate one n-type MOS transistor ne by an input b and to operate the other n-type MOS transistor NE by the inverse output ¬b of the input b, so as to turn on in case of the input 0 with respect to a source logic value −1. The operation of the function $f_{21}$ is shown in Table 12.

TABLE 12

Operation non-inverse function f21

| | | | | | 0 | | | −1 | | |
|---|---|---|---|---|---|---|---|---|---|---|
| b | −1 | 0 | 1 | PE1 | on | — | — | ne | — | on | on |
| ¬b | 1 | 1 | −1 | PE2 | — | — | on | NE | on | on | — |
| y | | | | PE1//PE2 | on | — | on | ne · NE | — | on | — |

Figure 21:
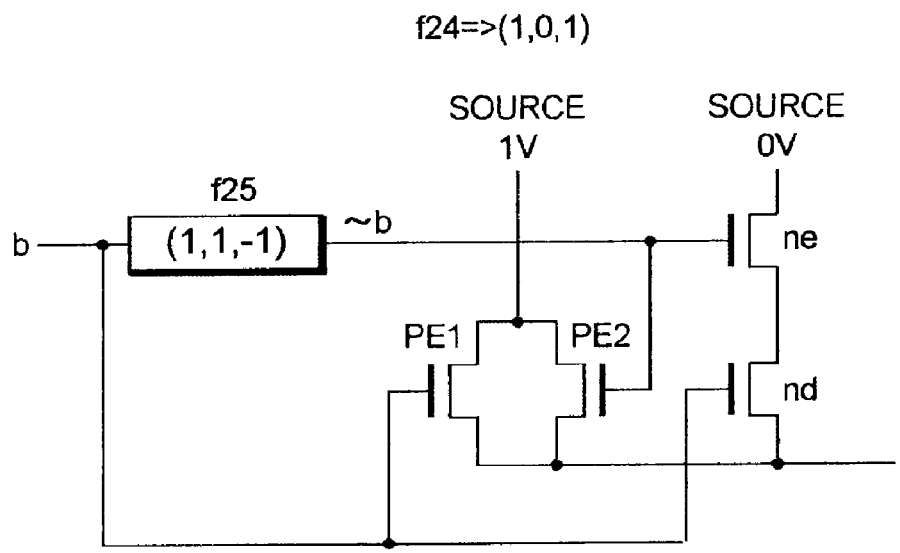
FIG. 21 is a diagram illustrating a circuit configuration for realizing a function $f_{24}$.

In the function $f_{24}$, (−1, 0, 1) is an input, and (1, 0, 1) is an output. Accordingly, as shown in FIG. 21, the function $f_{24}$, in which an input b passes through the inverse function $f_{25}$=(1, 1, −1) to invert the output to ¬b, is configured by inserting a parallel circuit of two enhancement p-type MOS transistors PE to operate one p-type MOS transistor PE1 by an input b and to operate the other p-type MOS transistor PE2 by the inverse output ¬b of the input b, so as to turn on in case of the inputs −1 and 1 with respect to a source logic value 1. The function $f_{24}$ can be realized by inserting a serial circuit of the depletion n-type MOS transistor nd and the enhancement n-type MOS transistor ne to operate one n-type MOS transistor nd by an input b and to operate the other n-type MOS transistor ne by the inverse output ¬b of the input b, so as to turn on in case of the input 0 with respect to a source logic value 0. The operation of the function $f_{24}$ is shown in Table 13.

TABLE 13

Operation non-inverse function f24

| | | | | 1 | | | 0 | | |
|---|---|---|---|---|---|---|---|---|---|
| b | −1 | 0 | 1 | PE1 | on | — | — nd | — | on | on |
| ¬b | 1 | 1 | −1 | PE2 | — | — | on ne | on | on | — |
| y | | | | PE1//PE2 | on | — | on nd · ne | — | on | — |

In this case, although the normal enhancement n-type MOS transistor ne is used as the enhancement n-type MOS transistor connected to the source logic value 0, the applicant of the invention confirmed that characteristics of the operation speed or the symmetry of waveform are improved by using the enhancement n-type MOS transistor nt having a positive threshold voltage smaller in absolute value than a threshold voltage of the n-type MOS transistor ne, in stead of the normal enhancement n-type MOS transistor ne. That is, in the function $f_{24}$, although the normal enhancement n-type transistor ne may be used as the enhancement n-type MOS transistor connected to the source logic value 0, it is possible to improve the operation speed and the symmetry of waveform of the three-valued logic function circuit by using the enhancement n-type MOS transistor nt having the positive threshold voltage smaller in absolute value than the normal threshold voltage.

Figure 22:
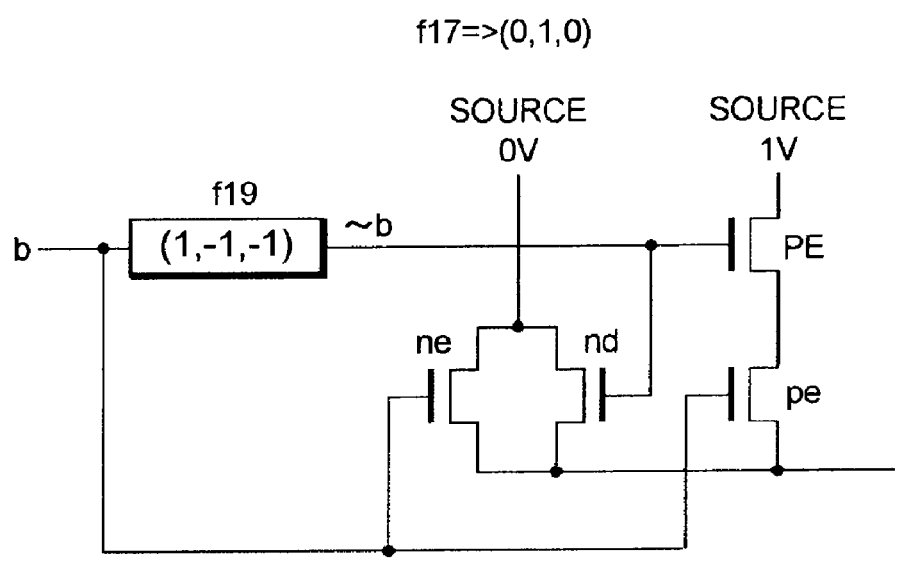
FIG. 22 is a diagram illustrating a circuit configuration for realizing a function $f_{17}$.

In the function $f_{17}$, (−1, 0, 1) is an input, and (0, 1, 0) is an output. Accordingly, as shown in FIG. 22, the function $f_{17}$, in which an input b passes through the inverse function $f_{19}$=(1, −1, −1) to invert the output to ¬b, is configured by inserting a parallel circuit of the enhancement n-type MOS transistors ne and depletion n-type MOS transistor nd to operate one n-type MOS transistor ne by an input b and to operate the other n-type MOS transistor nd by the inverse output ¬b of the input b, so as to turn on in case of the inputs −1 and 1 with respect to a source logic value 0. The function $f_{17}$ can be realized by inserting a serial circuit of two enhancement p-type MOS transistors pe and PE to operate one p-type MOS transistor pe by an input b and to operate the other p-type MOS transistor PE by the inverse output ¬b of the input b, so as to turn on in case of the input 0 with respect to a source logic value 1. The operation of the function $f_{17}$ is shown in Table 14.

TABLE 14

Operation
Complementary circuit of operation non-inverse function f17

| | | | | | 0 | | | 1 | | |
|---|---|---|---|---|---|---|---|---|---|---|
| b | −1 | 0 | 1 | ne | — | — | on pe | on | on | — |
| ¬b | 1 | 1 | −1 | nd | on | — | — PE | — | on | on |
| y | | | | ne//nd | on | — | on pe · PE | — | on | — |

Figure 23:
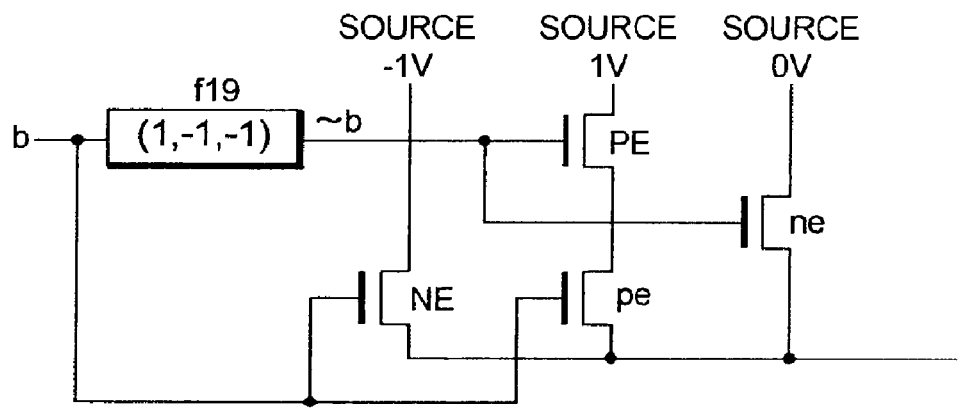
FIG. 23 is a diagram illustrating a circuit configuration for realizing a function $f_{16}$.

In the function $f_{16}$, (−1, 0, 1) is an input, and (0, 1, −1) is an output. Accordingly, as shown in FIG. 23, the function $f_{16}$, in which an input b passes through the inverse function $f_{19}$=(1, −1, −1) to invert the output to ¬b, is configured to operate the enhancement n-type MOS transistor ne by the inverse output ¬b of the input b, so as to turn on in case of the input −1 with respect to a source logic value 0. The function $f_{16}$ is configured by inserting a serial circuit of two enhancement p-type MOS transistors pe and PE to operate one p-type MOS transistor pe by an input b and to operate the other p-type MOS transistor PE by the inverse output ¬b of the input b, so as to turn on in case of the input 0 with respect to a source logic value 1. The function $f_{16}$ can be realized by operating the enhancement n-type MOS transistor NE by the input b, so as to turn on in case of the input 1 with respect to a source logic value −1. The operation of the function $f_{16}$ is shown in Table 15.

TABLE 15

Operation
Complementary circuit of operation non-inverse function f16

| | | | | | | 0 | | 1 | | | −1 | | |
|---|---|---|---|---|---|---|---|---|---|---|---|---|---|
| b | −1 | 0 | 1 | | | pe | on | on | — | | | | |
| ¬b | 1 | 1 | −1 | ne | on | — | — PE | | on | on | NE | — | — | on |
| y | | | | ne | on | — | — pe · PE | — | on | | NE | — | — | on |

As described above, the five kinds of functions $f_{11}$, $f_{12}$, $f_{20}$, $f_{21}$, and $f_{24}$ classified into Class 3 can be realized by a two-stage CMOS circuit.

Next, the method for realizing the five kinds of functions $f_{17}$, $f_{16}$, $f_{08}$, $f_{07}$, and $f_{04}$ that are classified into Class 3' as complementary symmetry circuits of the five kinds of functions $f_{11}$, $f_{12}$, $f_{20}$, $f_{21}$, and $f_{24}$ that are classified into Class 3 and are not the inverse function will be described. The functions $f_{17}$, $f_{16}$, $f_{08}$, $f_{07}$, and $f_{04}$ need the additional circuit fig, which converts the input (−1, 0, 1) into a two-value (1, −1, −1), on the input side thereof, and become two-stage CMOS circuits.

In this case, although the normal enhancement n-type MOS transistor ne is used as the enhancement n-type MOS transistor connected to the source logic value 0, the applicant of the invention confirmed that characteristics of the operation speed or the symmetry of waveform are improved by using the enhancement n-type MOS transistor nt having a positive threshold voltage smaller in absolute value than a threshold voltage of the n-type MOS transistor ne, in stead of the normal enhancement n-type MOS transistor ne. That is, in the function $f_{16}$, although the normal enhancement n-type transistor ne may be used as the enhancement n-type MOS transistor connected to the source logic value 0, it is possible to improve the operation speed and the symmetry of waveform of the three-valued logic function circuit by using the enhancement n-type MOS transistor nt having the positive threshold voltage smaller in absolute value than the normal threshold voltage.

Figure 24:
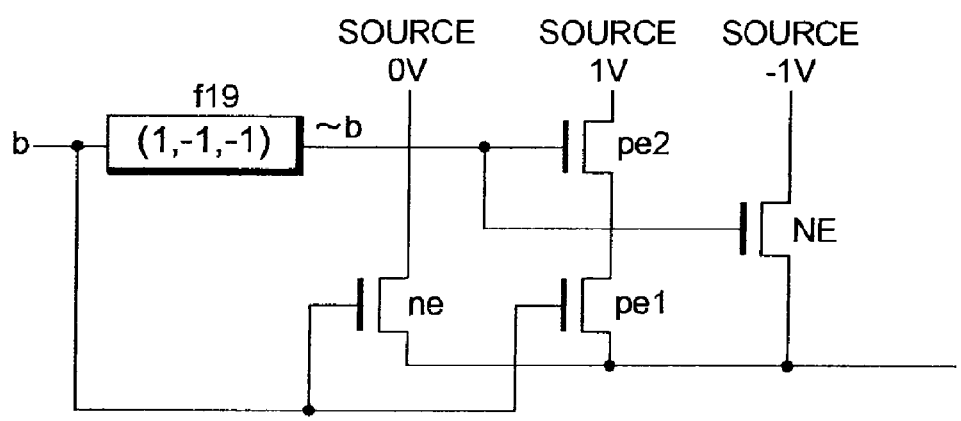
FIG. 24 is a diagram illustrating a circuit configuration for realizing a function $f_{08}$.

In the function $f_{08}$, (−1, 0, 1) is an input, and (−1, 1, 0) is an output. Accordingly, as shown in FIG. 24, the function $f_{08}$, in which an input b passes through the inverse function $f_{19}$=(1, −1, −1) to invert the output to ¬b, is configured to operate the enhancement n-type MOS transistor NE by the inverse output ¬b of the input b, so as to turn on in case of the input −1 with respect to a source logic value −1. The function $f_{08}$ is configured by inserting a serial circuit of two enhancement p-type MOS transistors pe to operate one p-type MOS transistor pe1 by an input b and to operate the other p-type MOS transistor pe2 by the inverse output ¬b of the input b, so as to turn on in case of the input 0 with respect to a source logic value 1. The function $f_{08}$ can be realized by operating the enhancement n-type MOS transistor ne by the input b, so as to turn on in case of the input 1 with respect to a source logic value 0. The operation of the function $f_{08}$ is shown in Table 16.

TABLE 16

Operation
Complementary circuit of operation non-inverse function f08

| | | | | | | −1 | | | 1 | | | 0 | | |
|---|---|---|---|---|---|---|---|---|---|---|---|---|---|---|
| b | −1 | 0 | 1 | | | | | pe1 | on | on | — | | | |
| ¬b | 1 | 1 | −1 | NE | on | — | — | pe2 | | on | on | ne | — | — | on |
| y | | | | NE | on | — | — | pe1·pe2 | — | on | | ne | — | — | on |

Figure 25:
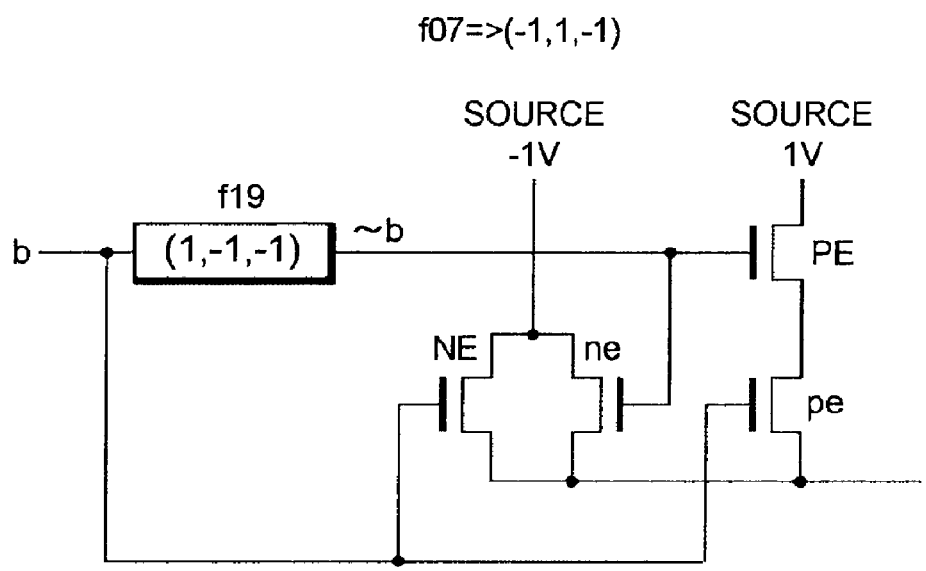
FIG. 25 is a diagram illustrating a circuit configuration for realizing a function $f_{07}$.

In the function $f_{07}$, (−1, 0, 1) is an input, and (−1, 1, −1) is an output. Accordingly, as shown in FIG. 25, the function $f_{07}$, in which an input b passes through the inverse function $f_{19}$= (1, −1, −1) to invert the output to ¬b, is configured by inserting a parallel circuit of two enhancement n-type MOS transistors NE and ne to operate one n-type MOS transistor NE by an input b and to operate the other n-type MOS transistor ne by the inverse output ¬b of the input b, so as to turn on in case of the inputs −1 and 1 with respect to a source logic value −1. The function $f_{07}$ can be realized by inserting a serial circuit of two enhancement p-type MOS transistors PE and pe to operate one p-type MOS transistor pe by an input b and to operate the other p-type MOS transistor PE by the inverse output ¬b of the input b, so as to turn on in case of the input 0 with respect to a source logic value 1. The operation of the function $f_{07}$ is shown in Table 17.

TABLE 17

Operation
Complementary circuit of operation non-inverse function f07

| | | | | | | −1 | | | 0 | | |
|---|---|---|---|---|---|---|---|---|---|---|---|
| b | −1 | 0 | 1 | NE | — | — | on | pe | on | on | — |
| ¬b | 1 | 1 | −1 | ne | on | — | — | PE | — | on | on |
| y | | | | NE//ne | on | — | on | pe·PE | — | on | — |

Figure 26:
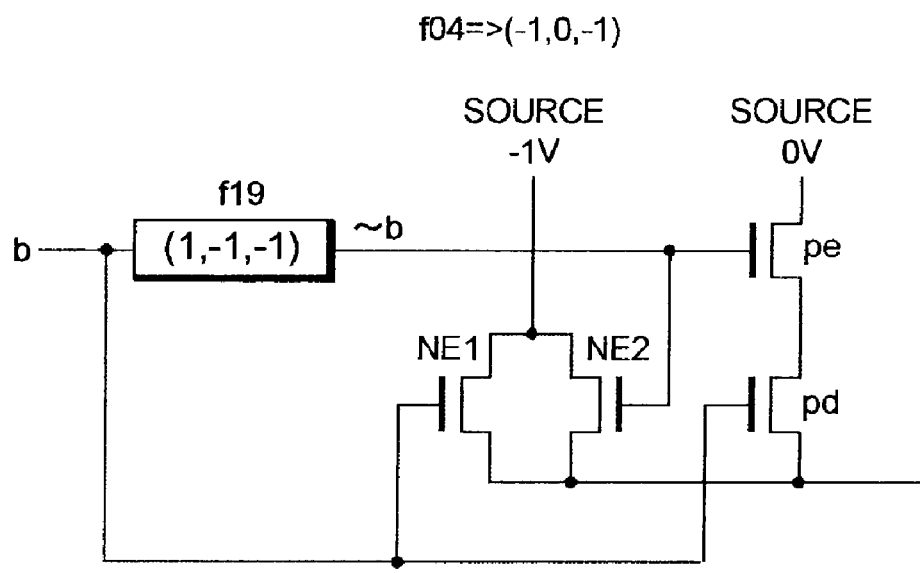
FIG. 26 is a diagram illustrating a circuit configuration for realizing a function $f_{04}$.

In the function $f_{04}$, (−1, 0, 1) is an input, and (−1, 0, −1) is an output. Accordingly, as shown in FIG. 26, the function $f_{04}$, in which an input b passes through the inverse function $f_{19}$= (1, −1, −1) to invert the output to ¬b, is configured by inserting a parallel circuit of two enhancement n-type MOS transistors NE to operate one n-type MOS transistor NE1 by an input b and to operate the other n-type MOS transistor NE2 by the inverse output ¬b of the input b, so as to turn on in case of the inputs −1 and 1 with respect to a source logic value −1. The function $f_{04}$ can be realized by inserting a serial circuit of the depletion p-type MOS transistor pd and the enhancement p-type MOS transistor pe to operate one p-type MOS transistor pd by an input b and to operate the other p-type MOS transistor pe by the inverse output ¬b of the input b, so as to turn on in case of the input 0 with respect to a source logic value 0. The operation of the function $f_{04}$ is shown in Table 18.

TABLE 18

Operation
Complementary circuit of operation non-inverse function f04

| | | | | | | −1 | | | 0 | | |
|---|---|---|---|---|---|---|---|---|---|---|---|
| b | −1 | 0 | 1 | NE1 | — | — | on pd | on | on | — |
| ¬b | 1 | 1 | −1 | NE2 | on | — | — pe | — | on | on |
| y | | | | NE1//NE2 | on | — | on pd·pe | — | on | — |

In this case, although the normal enhancement p-type MOS transistor pe is used as the enhancement p-type MOS transistor connected to the source logic value 0, the applicant of the invention confirmed that characteristics of the operation speed or the symmetry of waveform are improved by using the enhancement p-type MOS transistor pt having a positive threshold voltage smaller in absolute value than a threshold voltage of the p-type MOS transistor pe, in stead of the normal enhancement p-type MOS transistor pe. That is, in the function $f_{04}$, although the normal enhancement p-type transistor pe may be used as the enhancement p-type MOS transistor connected to the source logic value 0, it is possible to improve the operation speed and the symmetry of waveform of the three-valued logic function circuit by using the enhancement p-type MOS transistor pt having the positive threshold voltage smaller in absolute value than the normal threshold voltage.

As described above, the five kinds of functions $f_{17}$, $f_{16}$, $f_{08}$, for and $f_{04}$ classified into Class 3' can be realized by a two-stage CMOS circuit.

Next, the method for realizing the six kinds of functions $f_{02}$, $f_{03}$, $f_{05}$, $f_{09}$, $f_{15}$, and $f_{18}$ classified into Class 2 will be described. As described above, these functions $f_{02}$, $f_{03}$, $f_{05}$, $f_{09}$, $f_{15}$, and $f_{18}$ can be realized by providing inverters at the rear ends of the functions $f_{26}$, $f_{25}$, $f_{23}$, $f_{19}$, $f_{13}$, and $f_{10}$, respectively. ※「それぞれ」と表現していただけますでしょうか。

Figure 27:
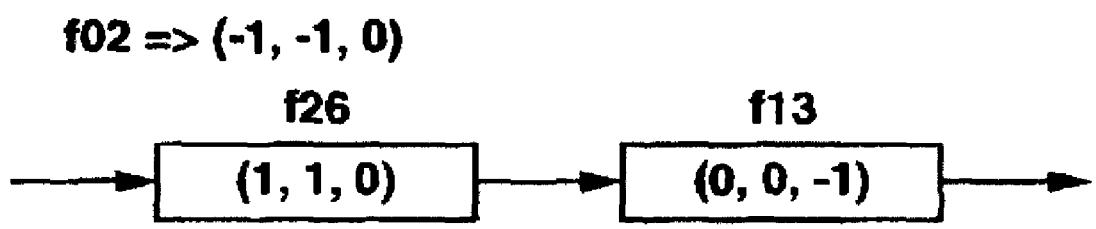
FIG. 27 is a diagram illustrating a circuit configuration for realizing a function $f_{02}$.

That is, in the function $f_{02}$, (−1, 0, 1) is an input, and (−1, −1, 0) is an output. Accordingly, as shown in FIG. 27, the function $f_{02}$ can be realized by providing the inverter $f_{13}$=(0, 0, −1) at the rear end of the function $f_{26}$=(1, 1, 0).

Figure 28:
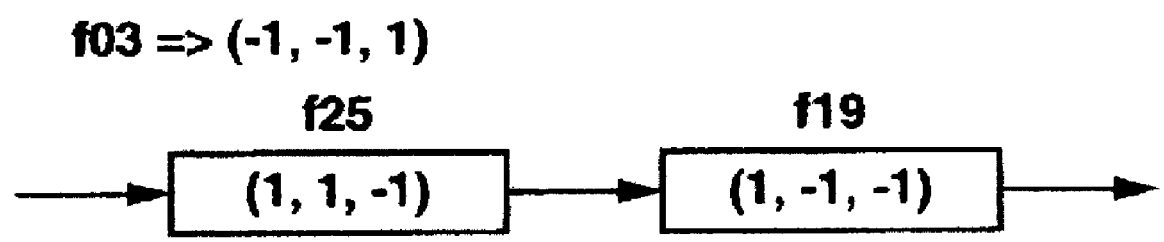
FIG. 28 is a diagram illustrating a circuit configuration for realizing a function $f_{03}$.

In the function $f_{03}$, (−1, 0, 1) is an input, and (−1, −1, 1) is an output. Accordingly, as shown in FIG. 28, the function $f_{03}$ can be realized by providing the inverter $f_{19}=(1, -1, 1)$ at the rear end of the function $f_{25}=(1, 1, -1)$.

Figure 29:
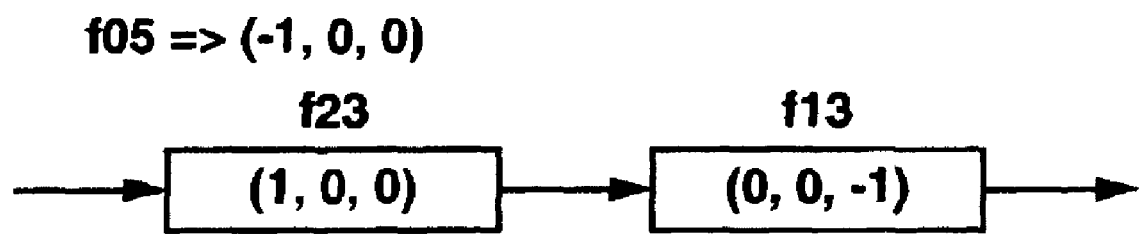
FIG. 29 is a diagram illustrating a circuit configuration for realizing a function $f_{05}$.

In the function $f_{05}$, $(-1, 0, 1)$ is an input, and $(-1, 0, 0)$ is an output. Accordingly, as shown in FIG. 29, the function $f_{05}$ can be realized by providing the inverter $f_{13}=(0, 0, -1)$ at the rear end of the function $f_{23}=(1, 0, 0)$.

Figure 30:
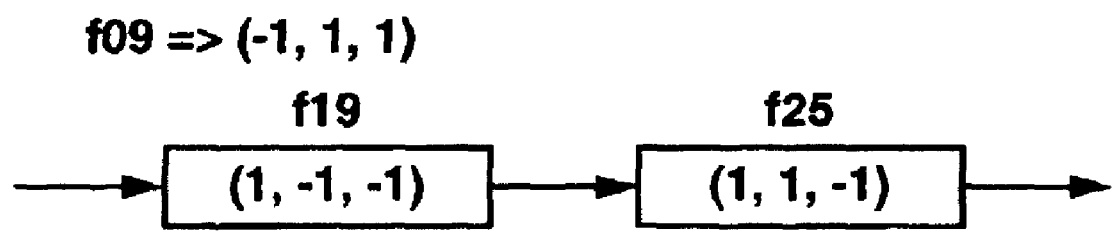
FIG. 30 is a diagram illustrating a circuit configuration for realizing a function $f_{09}$.

In the function $f_{09}$, $(-1, 0, 1)$ is an input, and $(-1, 1, 1)$ is an output. Accordingly, as shown in FIG. 30, the function $f_{09}$ can be realized by providing the inverter $f_{25}=(1, 1, -1)$ at the rear end of the function $f_{19}=(1, -1, -1)$.

Figure 31:
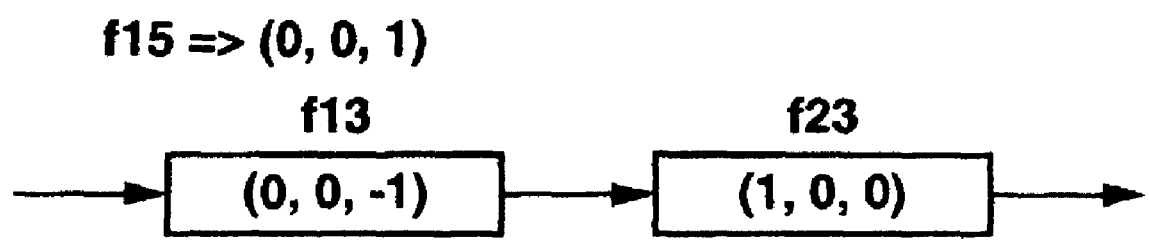
FIG. 31 is a diagram illustrating a circuit configuration for realizing a function $f_{15}$.

In the function $f_{15}$, $(-1, 0, 1)$ is an input, and $(0, 0, 1)$ is an output. Accordingly, as shown in FIG. 31, the function $f_{15}$ can be realized by providing the inverter $f_{23}=(1, 0, 0)$ at the rear end of the function $f_{13}=(0, 0, -1)$.

Figure 32:
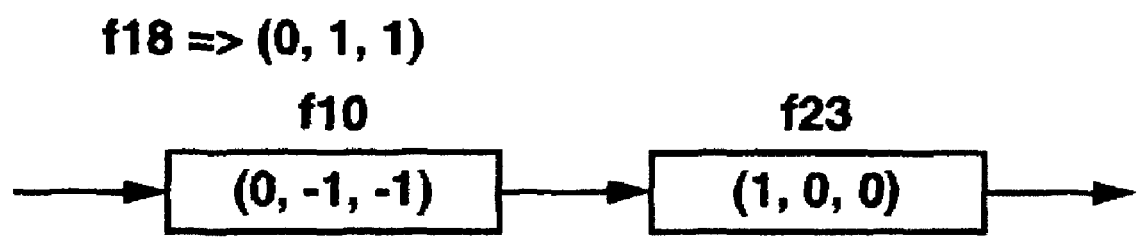
FIG. 32 is a diagram illustrating a circuit configuration for realizing a function $f_{18}$.

In the function $f_{18}$, $(-1, 0, 1)$ is an input, and $(0, 1, 1)$ is an output. Accordingly, as shown in FIG. 32, the function $f_{18}$ can be realized by providing the inverter $f_{23}=(1, 0, 0)$ at the rear end of the function $f_{10}=(0, -1, -1)$.

As described above, the six kinds of functions $f_{02}$, $f_{03}$, $f_{05}$, $f_{09}/f_{15}$, and $f_{18}$ classified into Class 2 can be realized by a complementary symmetry circuit and an inverter.

Hereinafter, a specific configuration of the three-valued logic function circuit that carries out the two-variable three-valued logic operation using such one-variable three-valued logic functions will be described. First, as the three-valued logic function circuit shown in FIG. 2, specifically, a circuit shown in FIG. 33 may be configured. In the same figure, a transfer gate T2 is obtained by reversing the transfer gate T2 up and down shown in FIG. 3B.

That is, in the three-valued logic function circuit, the function $f_{19}$ shown in FIG. 12 may be used as the one-variable three-valued logic function circuit C1 connected to the control terminal C-T1 of the transfer gate T1 and the control terminal C-T2b of the transfer gate T2, and the function $f_{09}$ shown in FIG. 30 may be used as the one-variable three-valued logic function circuit D1 connected to the control terminal D-T1 of the transfer gate T1 and the control terminal D-T2a of the transfer gate T2. In the three-valued logic function circuit, the function $f_{03}$ shown in FIG. 28 may be used as the one-variable three-valued logic function circuit C3 connected to the control terminal C-T3 of the transfer gate T3 and the control terminal C-T2a of the transfer gate T2, and the function $f_{25}$ shown in FIG. 15 may be used as the one-variable three-valued logic function circuit D3 connected to the control terminal D-T3 of the transfer gate T3 and the control terminal D-T2b of the transfer gate T2.

Figure 34:
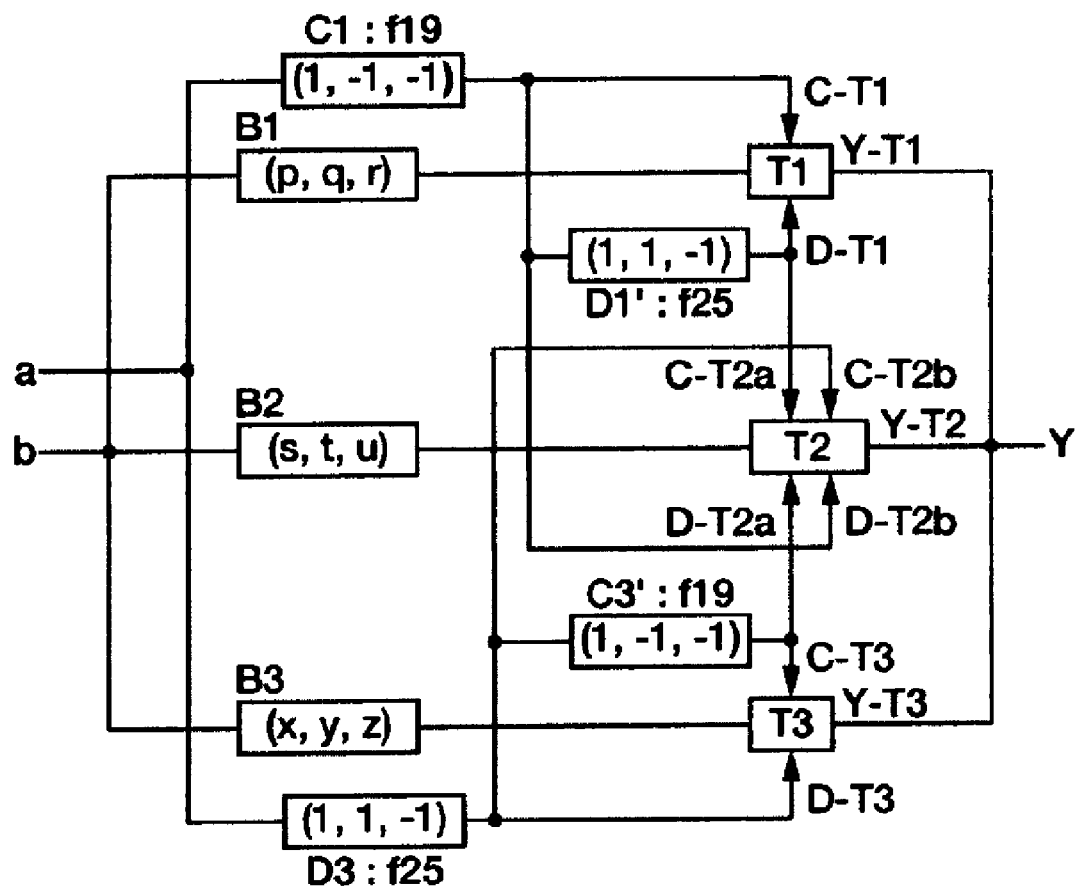
FIG. 34 is a diagram illustrating a detailed configuration of a three-valued logic function circuit obtained by simplifying the configuration shown in FIG. 33.

In the three-valued logic function circuit, the one-variable three-valued logic function circuit D1 configured as the function $f_{09}$ is configured by providing the inverter $f_{25}$ at the rear end of the function $f_{19}$, as described above, and thus can be realized by connecting the output of the one-variable three-valued logic function circuit C1 to the inverter $f_{25}$. Similarly, in the three-valued logic function circuit, the one-variable three-valued logic function circuit C3 configured as the function $f_{03}$ is configured by providing the inverter $f_{19}$ at the rear end of the function $f_{25}$, as described above, and thus can be realized by connecting the output of the one-variable three-valued logic function circuit D3 to the inverter $f_{19}$. Therefore, the three-valued logic function circuit can be simplified as shown in FIG. 34.

That is, in the three-valued logic function circuit, the function $f_{19}$ shown in FIG. 12 is used as the one-variable three-valued logic function circuit C1 connected to the control terminal C-T1 of the transfer gate T1, and the function $f_{25}$ shown in FIG. 15 as the one-variable three-valued logic function circuit D1' is connected to the rear end of the one-variable three-valued logic function circuit C1, which is connected to the control terminal D-T1 of the transfer gate T1 and the control terminal C-T2a of the transfer gate T2. In the three-valued logic function circuit, the function $f_{25}$ shown in FIG. 15 is used as the one-variable three-valued logic function circuit D3 connected to the control terminal D-T3 of the transfer gate T3, and the function $f_{19}$ shown in FIG. 12 as the one-variable three-valued logic function circuit C3' is connected to the rear end of the one-variable three-valued logic function circuit D3, which is connected to the control terminal C-T3 of the transfer gate T3 and the control terminal D-T2a of the transfer gate T2.

Figure 33:
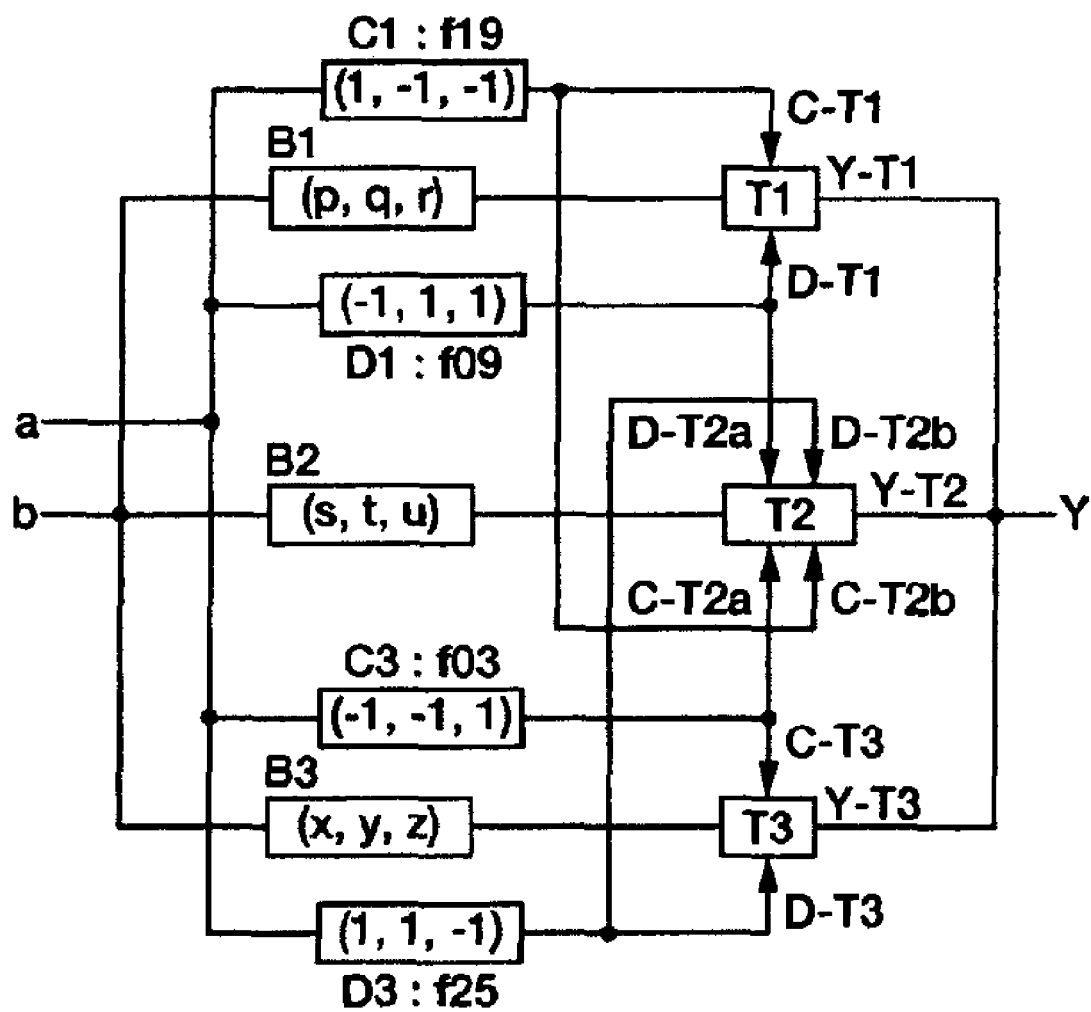
FIG. 33 is a diagram illustrating a detailed configuration of the three-valued logic function circuit shown in FIG. 2.

In such a three-valued logic function circuit, it is possible to reduce the number of necessary elements as compared with the configuration shown in FIG. 33. In addition, in the three-valued logic function circuit, it is possible to make delay time identical with respect to any input pattern, as described later.

As described above, in the three-valued logic function circuit, it is possible to simplify a circuit using complementary symmetry of used functions.

In carrying out logic operations, there are a lot of cases where degenerated operations are carried out using one-variable three-valued logic functions in which an output becomes equal to an input. That is, in the two-variable three-valued logic functions shown in Table 1, there is a case where an operation based on a function in which there may be a line or a row formed of the same elements. In the three-valued logic function circuit, it is possible to cope with such a degenerated two-variable three-valued logic operation.

First, in the two-variable three-valued logic function shown in Table 1, when the output (p, q, r) with respect to the input $a=-1$ is equal to the output (s, t, u) with respect to the input $a=0$, that is, (p, q, r)=(s, t, u), Table 1 may be shown in Table 19.

TABLE 19

Degenerated two-variable three-valued logic function (1)

| a | b |  |  |
|---|---|---|---|
|   | −1 | 0 | 1 |
| −1 | p | q | r |
| 0 | p | q | r |
| 1 | x | y | z |

Figure 35:
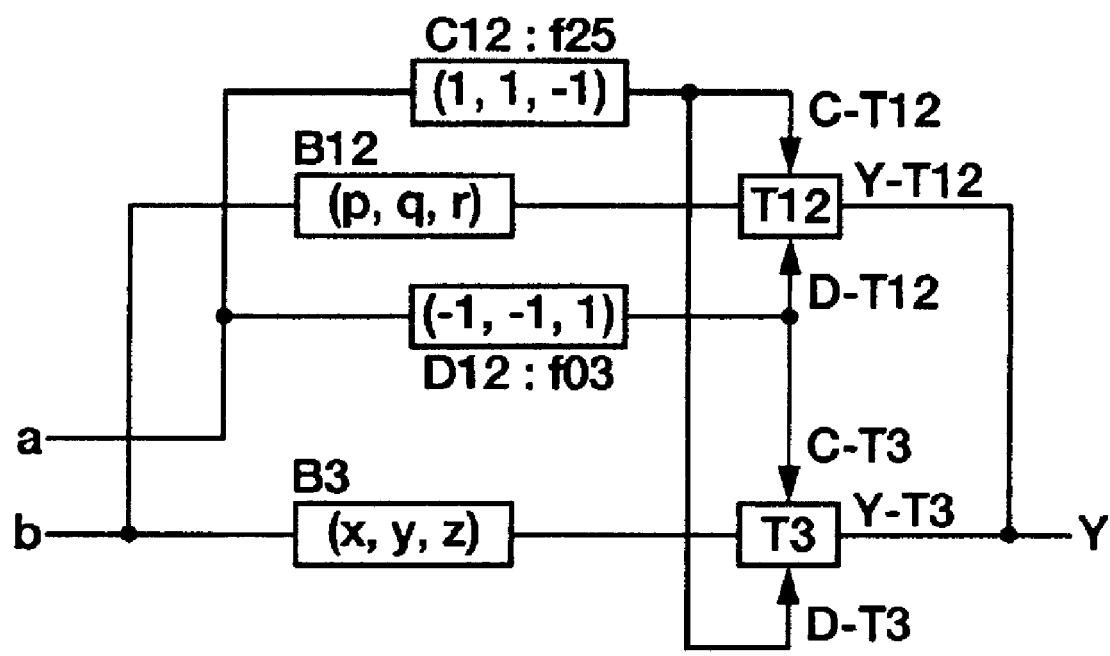
FIG. 35 is a diagram illustrating a detailed configuration of a three-valued logic function circuit that carries out a degenerated two-variable three-valued logic operation of (p, q, r)=(s, t, u).

The three-valued logic function circuit carrying out such a degenerated two-variable three-valued logic operation may be configured by modifying the configuration shown in FIG. 33, as shown in FIG. 35.

That is, in the three-valued logic function circuit, among three transfer gates T1, T2, and T3 shown in FIG. 33, roles of the transfer gate T1 outputting the one-variable three-valued logic function circuit B11=(p, q, r) with respect to the input $a=-1$, and the transfer gate T2 outputting the one-variable three-valued logic function circuit B2=(s, t, u) with respect to the input $a=0$ are integrated to be one transfer gate T12. The integrated transfer gate T12 is the same circuit as the transfer gate T1. In the three-valued logic function circuit, the one-variable three-valued logic function circuit C12 taking a logical sum of the one-variable three-valued logic function circuits C1 and C2 is connected to one control terminal C-T12 of the transfer gate T12, and the one-variable three-valued logic function circuit D12 taking a logical product of the one-variable three-valued logic function circuits D1 and D2 is connected to the other control terminal D-T12 of the transfer gate T12. In this case, the one-variable three-valued logic function circuit C12 is configured as the function $f_{25}=(1, 1,$ −1), and the one-variable three-valued logical function circuit D12 is configured as the function $f_{03}=(-1, -1, 1)$ that is complementarily symmetric with the function $f_{25}$.

In the three-valued logic function circuit, control signals supplied to the control terminals C-T3 and D-T3 of the transfer gate T3 connected to the other one-variable three-valued logic function circuit B3 are (−1, −1, 1) and (1, 1, −1), respectively, but they are not different from the functions $f_{03}$ and $f_{25}$. For this reason, in the three-valued logic function circuit, the control signal input to the control terminal D-T12 of the transfer gate T12 is input to the control terminal C-T3 of the transfer gate T3, and the control signal input to the control terminal C-T12 of the transfer gate T12 is input to the control terminal D-T3 of the transfer gate T3.

As described above, it is possible to configure the three-valued logic function circuit carrying out the degenerated two-variable three-valued logic operation in case of (p, q, r)=(s, t, u).

Next, in the two-variable three-valued logic function shown in Table 1, when the output (s, t, u) with respect to the input a=0 is equal to the output (x, y, z) with respect to the input a=1, that is, (s, t, u)=(x, y, z), Table 1 may be shown in Table 20.

TABLE 20

Degenerated two-variable three-valued logic function (2)

| a | b | | |
|---|---|---|---|
|   | −1 | 0 | 1 |
| −1 | p | q | r |
| 0 | s | t | u |
| 1 | s | t | u |

Figure 36:
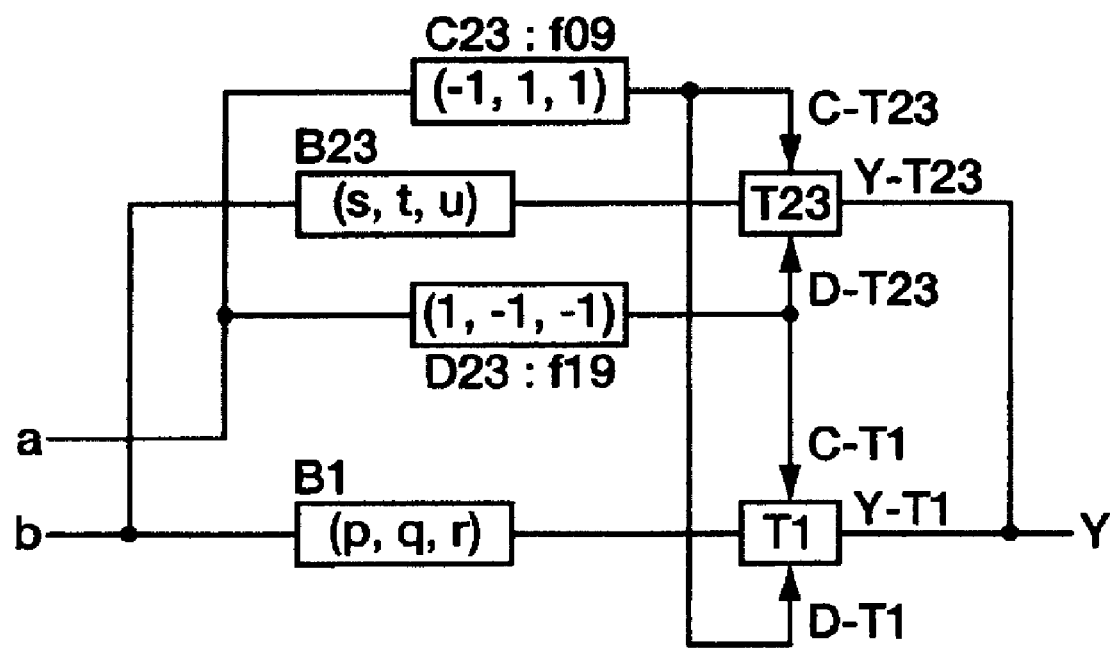
FIG. 36 is a diagram illustrating a detailed configuration of a three-valued logic function circuit that carries out a degenerated two-variable three-valued logic operation of (s, t, u)= (x, y, z).

The three-valued logic function circuit carrying out such a degenerated two-variable three-valued logic operation may be configured by modifying the configuration shown in FIG. 33, as shown in FIG. 36.

That is, in the three-valued logic function circuit, among three transfer gates T1, T2, and T3 shown in FIG. 33, roles of the transfer gate T2 outputting the one-variable three-valued logic function circuit B2=(s, t, u) with respect to the input a=0, and the transfer gate T3 outputting the one-variable three-valued logic function circuit B3=(x, y, z) with respect to the input a=1 are integrated to be one transfer gate T23. The integrated transfer gate T23 is the same circuit as the transfer gate T3, that is, the transfer gate T1. In the three-valued logic function circuit, the one-variable three-valued logic function circuit C23 taking a logical sum of the one-variable three-valued logic function circuits C2 and C3 is connected to the other control terminal C-T23 of the transfer gate T23, and the one-variable three-valued logic function circuit D23 taking a logical product of the one-variable three-valued logic function circuits D2 and D3 is connected to one control terminal D-T23 of the transfer gate T23. In this case, the one-variable three-valued logic function circuit C23 is configured as the function $f_{09}=(-1, 1, 1)$, and the one-variable three-valued logical function circuit D23 is configured as the function $f_{19}=(1, -1, -1)$ that is complementarily symmetric with the function $f_{09}$.

In the three-valued logic function circuit, control signals supplied to the control terminals C-T1 and D-T1 of the transfer gate T1 connected to the other one-variable three-valued logic function circuit B1 are (1, −1, −1) and (−1, 1, 1), respectively, but they are not different from the functions $f_{19}$ and $f_{09}$. For this reason, in the three-valued logic function circuit, the control signal input to the control terminal D-T23 of the transfer gate T23 is input to the control terminal C-T1 of the transfer gate T1, and the control signal input to the control terminal C-T23 of the transfer gate T23 is input to the control terminal D-T1 of the transfer gate T1.

As described above, it is possible to configure the three-valued logic function circuit carrying out the degenerated two-variable three-valued logic operation in case of (s, t, u)=(x, y, z).

Next, in the two-variable three-valued logic function shown in Table 1, when the output (x, y, z) with respect to the input a=1 is equal to the output (p, q, r) with respect to the input a=−1, that is, (x, y, z)=(p, q, r), Table 1 may be shown in Table 21.

TABLE 21

Degenerated two-variable three-valued logic function (3)

| a | b | | |
|---|---|---|---|
|   | −1 | 0 | 1 |
| −1 | x | y | z |
| 0 | s | t | u |
| 1 | x | y | z |

Figure 37:
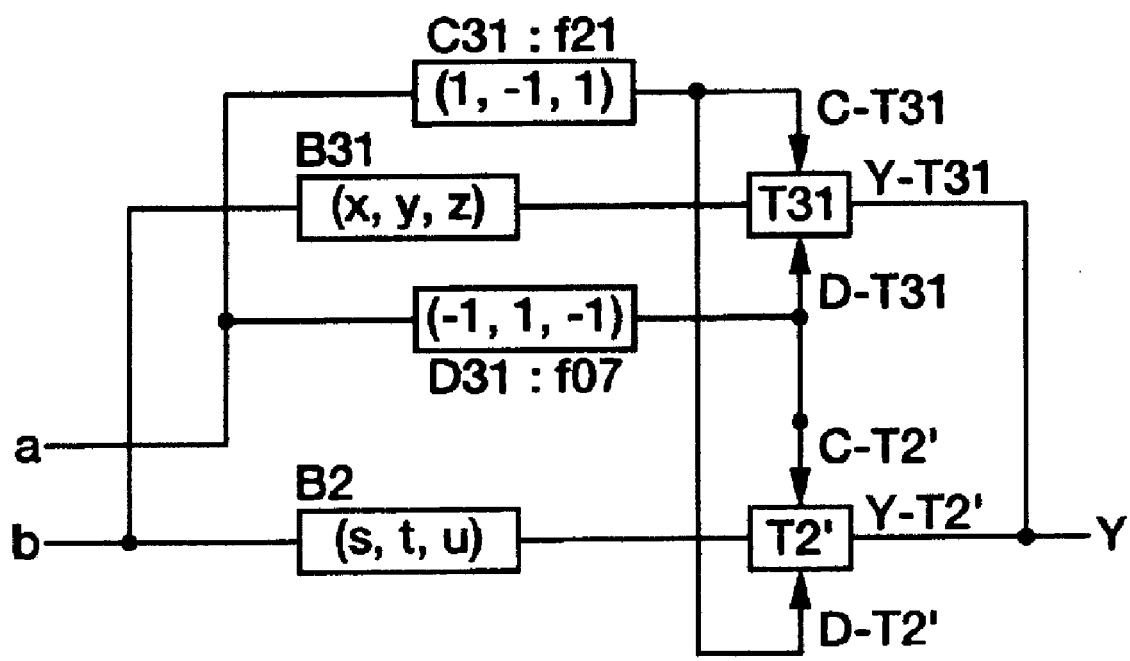
FIG. 37 is a diagram illustrating a detailed configuration of a three-valued logic function circuit that carries out a degenerated two-variable three-valued logic operation of (x, y, z)= (p, q, r).

The three-valued logic function circuit carrying out such a degenerated two-variable three-valued logic operation may be configured by modifying the configuration shown in FIG. 33, as shown in FIG. 37.

That is, in the three-valued logic function circuit, among three transfer gates T1, T2, and T3 shown in FIG. 33, roles of the transfer gate T3 outputting the one-variable three-valued logic function circuit B3=(x, y, z) with respect to the input a=1, and the transfer gate T1 outputting the one-variable three-valued logic function circuit B1=(p, q, r) with respect to the input a=−1 are integrated to be one transfer gate T31. The integrated transfer gate T31 is the same circuit as the transfer gate T3, that is, the transfer gate T1. In the three-valued logic function circuit, the one-variable three-valued logic function circuit C31 taking a logical sum of the one-variable three-valued logic function circuits C3 and C1 is connected to one control terminal C-T31 of the transfer gate T31, and the one-variable three-valued logic function circuit D31 taking a logical product of the one-variable three-valued logic function circuits D3 and D1 is connected to the other control terminal D-T31 of the transfer gate T31. In this case, the one-variable three-valued logic function circuit C31 is configured as the function $f_{21}=(1, -1, 1)$, and the one-variable three-valued logical function circuit D31 is configured as the function $f_{07}=(-1, 1, -1)$ that is complementarily symmetric with the function $f_{21}$.

In the three-valued logic function circuit, with respect to the transfer gate T2 connected to the other one-variable three-valued logic function circuit B2, it is not the serial switch shown in FIG. 3B, but may be the same circuit as the transfer gate T31 configured by integrating the transfer gates T3 and T1. When this is made into a transfer gate T2', in the three-valued logic function circuit, control signals supplied to the control terminals C-T2' and D-T2' of the transfer gate T2' are (−1, 1, −1) and (1, −1, 1), respectively, but they are not different from the functions $f_{07}$ and $f_{21}$. For this reason, in the three-valued logic function circuit, the control signal input to the control terminal D-T31 of the transfer gate T31 is input to the control terminal C-T2' of the transfer gate T2', and the control signal input to the control terminal C-T31 of the transfer gate T31 is input to the control terminal D-T2' of the transfer gate T2'.

As described above, it is possible to configure the three-valued logic function circuit carrying out the degenerated two-variable three-valued logic operation in case of (x, y, z)=(p, q, r).

Figure 38:
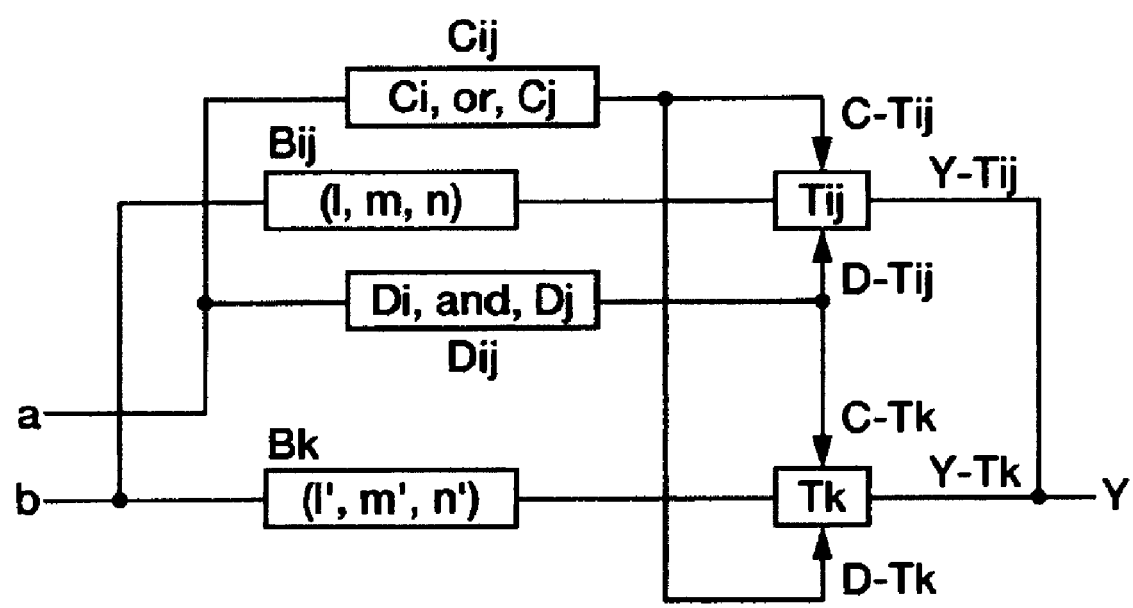
FIG. 38 is a diagram illustrating a generalized configuration of a degenerated three-valued logic function circuit.

The degenerated three-valued logic function described above may be represented by generalization as shown in FIG. 38.

First, when any two of three one-variable three-valued logic function circuits B1, B2, and B3 obtaining outputs according to logic values −1, 0, and 1 of one input b are the same as each other, the same one-variable three-valued logic function circuits Bi and Bj are integrated into a one-variable three-valued logic function circuit Bij, and the other one-variable three-valued logic function circuit is Bk.

Then, transfer gates Ti and Tj connected to the one-variable three-valued logic function circuits Bi and Bj of three transfer gates T1, T2, and T3 turned on according to logic values −1, 0, 1 of the other input a are integrated into a transfer gate Tij, and the transfer gate Tij is connected to the integrated one-variable three-valued logic function circuit Bij. A transfer gate connected to the other one-variable three-valued logic function circuit Bk is Tk, two control terminals of the transfer gate Tij are C-Tij and D-Tij, and two control terminals of the transfer gate Tk are C-Tk, and D-Tk. When the transfer gate Tk is the transfer gate T2, it is naturally T2'.

The one-variable three-valued logic function circuit connected to the control terminal C-Tij of the integrated transfer gate Tij is Cij taking a logical sum of the one-variable three-valued logic function circuits Ci and Cj, and the one variable three-valued logic function circuit connected to the control terminal D-Tij is Dij taking a logical product of the one-variable three-valued logic function circuits Di and Dj.

One control terminal C-Tk of the other transfer gate Tk is connected to an output of the one-variable three-valued logic function circuit Dij, and the other control terminal D-Tk is connected to an output of the one-variable three-valued logic function circuit Cij.

With such a configuration, the degenerated three-valued logic function circuit can be obtained by generalization as shown in FIG. 38.

Such a degenerated three-valued logic function circuit may be simplified.

That is, in the configuration shown in FIG. 38, when attention is paid to the point that the one-variable three-valued logic function circuits Bij and Bk connected to the input b are in relation of complementary symmetry and the outputs of the one-variable three-valued logic function circuits Cij and Dij connected to the control terminals T-Cij and T-Dij of the transfer gate Tij are in relation of complementary symmetry, it can be known that any one inverse circuit of the one-variable three-valued logic function circuits Cij and Dij may be used instead of any one of the one-variable three-valued logic function circuits Dij and Cij. Accordingly, the degenerated three-valued logic function circuit may be simplified as shown in FIG. 39 or 40.

Figure 39:
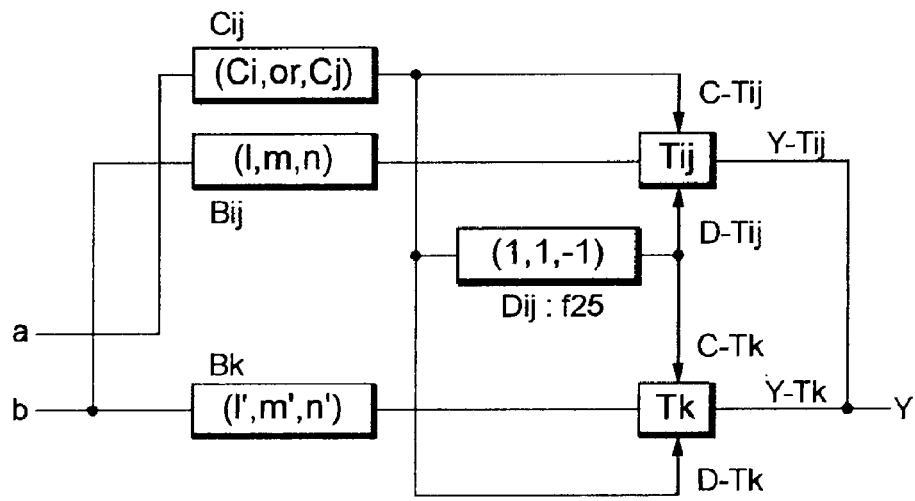
FIG. 39 is a diagram illustrating a configuration of a three-valued logic function circuit obtained by simplifying the configuration shown in FIG. 38.

First, in case of a configuration of leaving the one-variable three-valued logic function circuit Cij, as shown in FIG. 39, the one-variable three-valued logic function circuit connected to the control terminal C-Tij of the integrated transfer gate Tij is Cij taking a logical sum of the one-variable three-valued logic function circuits Ci and Cj, and the one-variable three-valued logic function circuit connected to the control terminal D-Tij is an inverter D'ij (=$f_{25}$) that inverts an output of the one-variable three-valued logic function circuit Cij.

One control terminal C-Tk of the other transfer gate Tk is connected to an output of the inverter D'ij, and the other control terminal D-Tk is connected to an output of the one-variable three-valued logic function circuit Cij.

Figure 40:
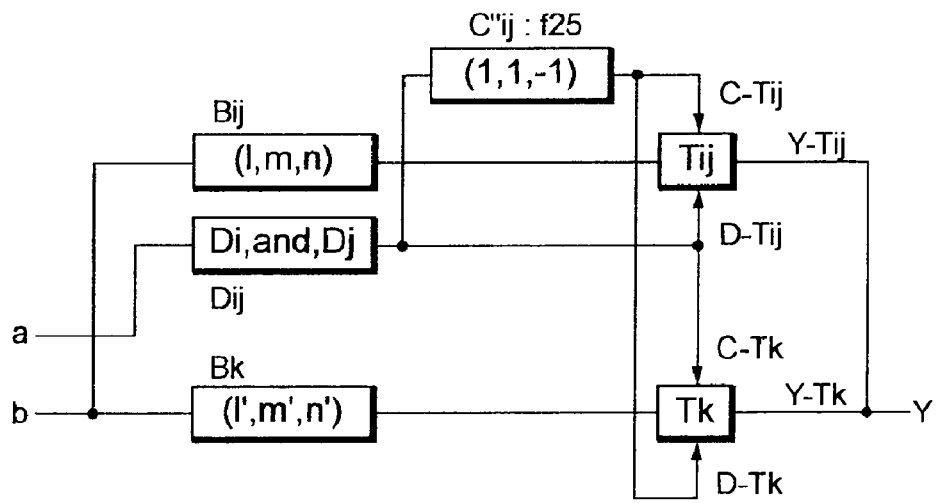
FIG. 40 is a diagram illustrating a configuration of a three-valued logic function circuit obtained by simplifying the configuration shown in FIG. 38, which is different from the configuration shown in FIG. 39.

In case of a configuration of leaving the one-variable three-valued logic function circuit Dij, as shown in FIG. 40, the one-variable three-valued logic function circuit connected to the control terminal D-Tij of the integrated transfer gate Tij is Dij taking a logical product of the one-variable three-valued logic function circuits Di and Dj, and the one-variable three-valued logic function circuit connected to the control terminal C-Tij is an inverter C"ij (=$f_{25}$) that inverts an output of the one-variable three-valued logic function circuit Dij.

One control terminal C-Tk of the other transfer gate Tk is connected to an output of the one-variable three-valued logic function circuit Dij, and the other control terminal D-Tk is connected to an output of the inverter C"ij.

As described above, the degenerated three-valued logic function circuit may be simply configured.

As described above, the configuration of the three-valued logic function circuit for realizing all two-variable three-valued logic functions using the plural one-variable three-valued logic function circuits and three transfer gates has been described. In such a three-valued logic function circuit, it is possible to configure symmetry of Start switching time and End switching time, even using both of the n-type MOS transistor and the p-type MOS transistor. Hereinafter, this configuration will be described.

First, seven kinds of inverse circuits $f_{10}, f_{13}, f_{19}, f_{22}, f_{23}, f_{25}$, and $f_{26}$ of the aforementioned 17 kinds of one-variable three-valued logic function circuits to be realized will be described.

In all of these inverse circuits except the function $f_{22}$ that is the three-valued inverter, source terminals of n-type MOS transistors and p-type MOS transistors are connected to two different source logic, that is, two different power sources, and drains terminals are coupled to form an output terminal and have the same structure as the two-valued CMOS inverter.

It has been known that asymmetry of the switching time is caused by difference in carrier mobility of an n-type MOS transistor and a p-type MOS transistor. In the two-valued CMOS inverter, to compensate the asymmetry of the switching time caused by carrier mobility of the n-type MOS transistor and p-type MOS transistor, a gate width forming each channel of the n-type MOS transistor and p-type MOS transistor is adjusted, and turning-on resistances (on-resistance) of the n-type MOS transistor and p-type MOS transistor are the same, thereby identifying the switching time of Start and the switching time of End.

Also in the three-valued logic function circuit, similarly with the case of the two-valued logic function circuit, a gate width of each of the n-type MOS transistor and p-type MOS transistor is adjusted in the inverse circuits except the three-valued inverter of the function $f_{22}$, thereby identifying the switching time of Start and the switching time of End.

In the three-valued inverter of the function $f_{22}$, in addition to two source logic values −1 and +1, there are depletion n-type MOS transistor and p-type MOS transistor connected to a source logic value 0 in series. This transistor serves as drawing into 0, in case of an output terminal −1 or +1. Start time or End time thereof depends on on-resistance of the depletion n-type MOS transistor and p-type MOS transistor connected in series, but it is possible to make the on-resistance into a design target value by adjusting the gate width of each of the n-type MOS transistor and p-type MOS transistor. Accordingly, in the three-valued logic function circuit, it is possible to identify the switching time of Start and the switching time of End of the n-type MOS transistor and p-type MOS transistor connected to the source logic values 1 and −1, even with respect to the inverse circuit $f_{22}$. The on-resistance of the MOS transistor is in inverse proportion to the gate width. Accordingly, in the three-valued logic function circuit, the gate width of the depletion n-type MOS transistor and p-type MOS transistor may be twice the gate width of the normal MOS transistor.

Next, a method of removing asymmetry of the switching time in case of five kinds of non-inverse circuits $f_{11}$, $f_{12}$, $f_{20}$, $f_{21}$, and $f_{24}$; and complementary symmetry circuits $f_{17}$, $f_{16}$, $f_{08}$, $f_{07}$, and $f_{04}$ thereof will be described.

Figure 41:
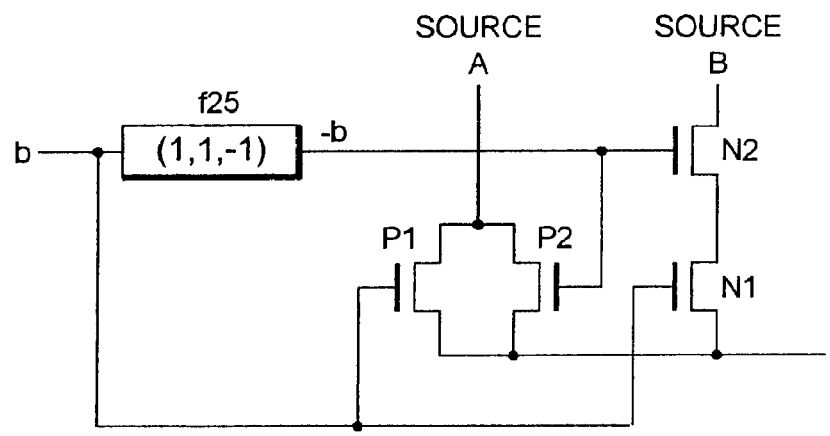
FIG. 41 is a diagram illustrating a configuration of a non-inverse circuit.
Figure 42:
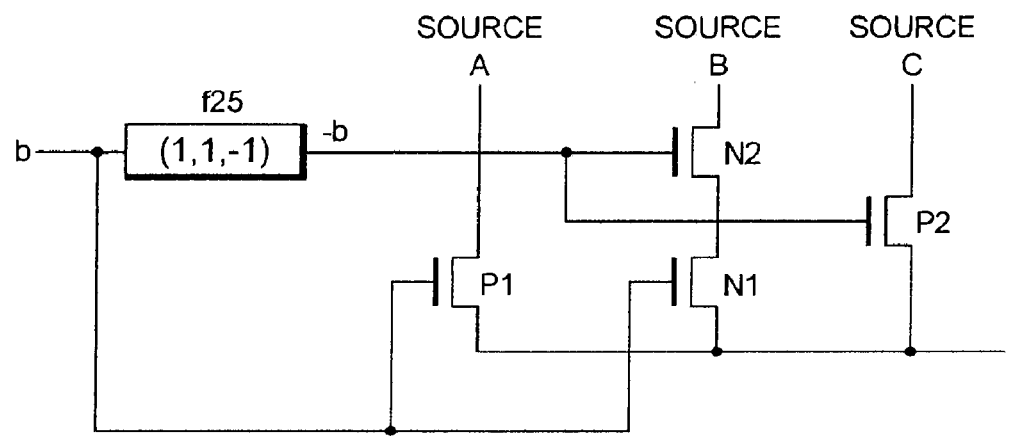
FIG. 42 is a diagram illustrating a configuration of a non-inverse circuit, which is different from the configuration shown in FIG. 41.

First, the non-inverse circuits $f_{11}$, $f_{12}$, $f_{20}$, $f_{21}$, and $f_{24}$ are mainly classified into non-inverse circuits $f_{11}$, $f_{21}$, and $f_{24}$ and non-inverse circuits $f_{12}$ and $f_{20}$, according to configurations. As shown in FIG. 41, the former includes two p-type MOS transistors P1 and P2 connected to a source logic value A in parallel, and two n-type MOS transistors N1 and N2 connected to a source logic value B in series. Meanwhile, as shown in FIG. 42, the later includes a p-type MOS transistor P1 connected to a source logic value A, a p-type MOS transistor P2 connected to a source logic value C, and two n-type MOS transistors N1 and N2 connected to a source logic value B in series.

In the non-inverse circuits $f_{11}$, $f_{21}$, and $f_{24}$ having the former configuration shown in FIG. 41, each of one p-type MOS transistor P2 of the p-type MOS transistors connected in parallel, and one n-type MOS transistor N2 of the n-type MOS transistors connected in series is operated by an inverse output ¬b obtained through an inverse circuit that inverts an input b, but the other p-type MOS transistor P1 and n-type MOS transistor N1 are operated directly by the input b.

In the n-type MOS transistors N1 and N2 connected in series, although the n-type MOS transistor N1 is operated directly by the input b, the n-type MOS transistor N2 operated by the inverse output ¬b is turned on with delay. Accordingly, the timing of turning-on is determined depending on the n-type MOS transistor N2.

In the p-type MOS transistors P1 and P2 connected in parallel, the p-type MOS transistor P1 is operated directly by the input b. Accordingly, the timing of turning-on is early as much as the delay time caused by the inverse circuit.

Therefore, in the non-inverse circuits $f_{11}$, $f_{21}$, and $f_{24}$, the output X with respect to the input −1 among the outputs (X, Y, X) with respect to the inputs (−1, 0, 1) is earlier than the outputs Y and X with respect to the other inputs 0 and 1, as much as the delay time caused by the inverse circuit.

Thus, in these non-inverse circuits $f_{11}$, $f_{21}$, and $f_{24}$, to remove such asymmetry in output, a response speed of the p-type MOS transistor P1 operated directly by the input b is delayed. Specifically, in the non-inverse circuits $f_{11}$, $f_{21}$, and $f_{24}$, the on-resistance may be raised. However, in the non-inverse circuits $f_{11}$, $f_{21}$, and $f_{24}$, not to have an influence on the other circuits, it is necessary to keep gate capacity regular.

In this case, the on-resistance is in proportion to a gate length, and is in inverse proportion to a gate width. Meanwhile, the gate capacity is in proportion to a gate area, that is, a product of the gate length and the gate width.

Accordingly, in the non-inverse circuits $f_{11}$, $f_{21}$, and $f_{24}$, the p-type MOS transistor P1 may be configured such that the gate length is made large and the gate width is made small, under the condition of keeping the gate area regular.

With such a configuration, in the non-inverse circuit $f_{11}$, $f_{21}$, and $f_{24}$, it is possible to solve the asymmetry of the switching time. In addition, power consumption of the MOS transistor is in proportion to the gate capacity. From this point, in the non-inverse circuits $f_{11}$, $f_{21}$, and $f_{24}$, there is no change in power consumption because the gate capacity is kept regular, even when the gate length and the gate width of the p-type MOS transistor P1 are changed.

In the non-inverse circuits $f_{12}$ and $f_{20}$ having the later configuration shown in FIG. 42, the transistor operated directly by the input b is the p-type MOS transistor P1 connected to a source logic value A. In the non-inverse circuits $f_{12}$ and $f_{20}$, the timing of turning on this p-type MOS transistor P1 is early as much as the delay time caused by the inverse circuit, as compared with the n-type MOS transistor N2 and the p-type MOS transistor P2, which are operated by the inverse output ¬b obtained by the inverse circuit that inverts the input b.

Thus, in the non-inverse circuit $f_{12}$ and $f_{20}$, to remove such asymmetry in output, as described above, the p-type MOS transistor P1 operated directly by the input b is configured such that the gate length is made large and the gate with is made small, under the condition of keeping the gate area regular, thereby delaying the response speed.

With such a configuration, in the non-inverse circuits $f_{12}$ and $f_{20}$, it is possible to solve the asymmetry of the switching time. In addition, even in the non-inverse circuits $f_{12}$ and $f_{20}$, there is no change in power consumption because the gate capacity of the p-type MOS transistor P1 is kept regular.

Next, a method of removing asymmetry of the switching time in case of the complementary symmetry circuits $f_{17}$, $f_{16}$, $f_{08}$, $f_{07}$, and $f_{04}$ of the non-inverse circuits $f_{11}$, $f_{12}$, $f_{20}$, $f_{21}$, and $f_{24}$ will be described.

The complementary symmetry circuits $f_{17}$, $f_{16}$, $f_{08}$, $f_{07}$, and $f_{04}$ are mainly classified into the complementary symmetry circuits $f_{17}$, $f_{07}$, and $f_{04}$; and the complementary symmetry circuits $f_{16}$ and $f_{08}$, according to configurations thereof, as well as the non-inverse circuits $f_{11}$, $f_{12}$, $f_{20}$, $f_{21}$, and $f_{24}$. The former is the same as the non-inverse circuits $f_{11}$, $f_{21}$, and $f_{24}$ shown in FIG. 41, and the later is the same as the non-inverse circuits $f_{12}$ and $f_{20}$ shown in FIG. 42. Accordingly, in the complementary symmetry circuits $f_{17}$, $f_{16}$, $f_{08}$, $f_{07}$, and $f_{04}$, it is possible to remove asymmetry of the switching time of Start and the switching time of End by the same method of the non-inverse circuits $f_{11}$, $f_{12}$, $f_{20}$, $f_{21}$, and $f_{24}$. In addition, also in the complementary symmetry circuits $f_{17}$, $f_{16}$, $f_{08}$, $f_{07}$, and $f_{04}$, there is no change in power consumption because the gate capacity of the p-type MOS transistor P1 is kept regular.

As described above, in the three-valued logic function circuit, it is possible to configure symmetry of Start switching time and End switching time, even using both of the n-type MOS transistor and the p-type MOS transistor.

In the three-valued logic function circuit, it is possible to remove the asymmetry of the switching time of Start and the switching time of End with such a configuration, However, there may be difference in delay time due to change in input pattern, even when the Start switching time and the End switching time are identified.

However, in the three-valued logic function circuit, it is possible to assure that the delay times are identified with respect to any input pattern. Hereinafter, the reason will be described.

First, the three-valued logic function circuit with the configuration shown in FIG. 33 will be described.

In the three-valued logic function circuit, the one-variable three-valued logic function circuit C1 operating the control terminal C-T1 of the transfer gate T1 and the control terminal C-T2b of the transfer gate T2, and the one-variable three-valued logic function circuit D3 operating the control terminal D-T3 of the transfer gate T3 and the control terminal D-T2b of the transfer gate T2 are the inverse circuits $f_{19}$ and $f_{25}$, respectively. As shown in FIGS. 12 and 15, these inverse circuits $f_{19}$ and $f_{25}$ can be realized by the one-stage transistor circuit. Accordingly, the delay time thereof is shorter than that of the non-inverse circuit or the complementary symmetry circuit that needs the two-stage transistor circuit.

However, the one-variable three-valued logic function circuit D1 operating the control terminal D-T1 of the transfer gate T1 and the control terminal D-T2a of the transfer gate T2, and the circuit C3 operating the control terminal C-T3 of the transfer gate T3 and the control terminal C-T2a of the transfer gate T2 are the non-inverse circuits $f_{09}$ and $f_{03}$, respectively. That is, the delay time thereof is longer than that of the non-inverse circuit due to the configuration of two-stage transistor.

As a result, the timing of turning on or off three transfer gates T1, T2, and T3 is determined depending on the control signal having a large delay time. Accordingly, in the three-valued logic function circuit, the delay time of passing through the transfer gates T1, T2, and T3 is determined from the circuit configured by the two-stage transistor, which is regular, irrespective of input pattern.

In consideration of the transfer gates T1, T2, and T3, the transfer gates T1 and T3 are a switch of a one-stage pass transistor, but the transfer gates T2 is a switch of a two-stage pass transistor. In general, the switching time of the two-stage pass transistor is longer than that of the one-stage pass transistor.

However, in the three-valued logic function circuit, when the on-resistances at the time of turning on the switches are the same, it is possible to effectively remove difference in switching time. Also, in the three-valued logic function circuit, to make on-resistances of switches equal to each other, the gate length of the pass transistors of the transfer gates T1 and T3 may be made twice the standard gate length.

Next, the three-valued logic function circuit having the simple configuration shown in FIG. 34 will be described.

In the three-valued logic function circuit shown in FIG. 34, the inverse circuit $f_{25}$ is connected in series to the one-variable three-valued logic function circuit C1 instead of the one-variable three-valued logic function circuit D1 in the three-valued logic function circuit shown in FIG. 33, and the inverse circuit $f_{25}$ is connected in series to the one-variable three-valued logic function circuit D3 instead of the one-variable three-valued logic function circuit C3. Accordingly, the configuration of the common part of one-variable three-valued logic function circuits C1 and D3 is made from the one-variable three-valued logic function circuits D1 and C3.

The operation timing in such a three-valued logic function circuit is completely the same as that of the three-valued logic function circuit shown in FIG. 33, and the delay times of the signals passing through the three transfer gates T1, T2, and T3 are determined from the circuit configured by the two-stage transistor irrespective of input pattern, which are regular.

As described above, the three-valued logic function circuit according to the embodiment of the invention is configured using the three transfer gates T1, T2, and T3 and the plural one-variable three-valued logic function circuits turning on or off these transfer gates T1, T2, and T3. The operation of such a three-valued logic function circuit will be described with reference to the configuration shown in FIG. 33 as follows.

First, in the three-valued logic function circuit, when an input a is −1, the one-variable three-valued logic function circuit C1 outputs 1 and the one-variable three-valued logic function circuit D1 obtaining an output complementarily symmetric with the signal thereof outputs −1. In addition, in the three-valued logic function circuit, when an input a is −1, the one-variable three-valued logic function circuit C3 outputs −1, and the one-variable three-valued logic function circuit D3 obtaining an output complementarily symmetric with the signal thereof outputs 1. The output of the one-variable three-valued logic function circuit C1 and the output of the one-variable three-valued logic function circuit D1 turn on the transfer gate T1. On the contrary, the output of the one-variable three-valued logic function circuit C3 and the output of the one-variable three-valued logic function circuit D3 turn off the transfer gate T3. In addition, the output of the one-variable three-valued logic function circuit C1 and the output of the one-variable three-valued logic function circuit D3 turn off the transfer gate T2. As a result, in the three-valued logic function circuit, only the transfer gate T1 is turned on, and the output of the one-variable three-valued logic function circuit B1=(p, q, r) connected to the input b is selected.

Therefore, the output Y of the three-valued logic function circuit becomes p, q, and r according to the values −1, 0, and 1 of the input b.

In the three-valued logic function circuit, when an input a is 0, the one-variable three-valued logic function circuit C1 outputs −1 and the one-variable three-valued logic function circuit D1 obtaining an output complementarily symmetric with the signal thereof outputs 1. In addition, in the three-valued logic function circuit, when an input a is 0, the one-variable three-valued logic function circuit C3 outputs −1, and the one-variable three-valued logic function circuit D3 obtaining an output complementarily symmetric with the signal thereof outputs 1. The output of the one-variable three-valued logic function circuit C1 and the output of the one-variable three-valued logic function circuit D1 turn off the transfer gate T1, and the output of the one-variable three-valued logic function circuit C3 and the output of the one-variable three-valued logic function circuit D3 turn off the transfer gate T3. In addition, in the three-valued logic function circuit, all of the output of the one-variable three-valued logic function circuit D1 and the output of the one-variable three-valued logic function circuit D3 are 1, and all of the output of the one-variable three-valued logic function circuit C1 and the output of the one-variable three-valued logic function circuit C3 are −1. Accordingly, the transfer gate T2 is turned on. As a result, in the three-valued logic function circuit, only the transfer gate T2 is turned on, and the output of the one-variable three-valued logic function circuit B2=(s, t, u) connected to the input b is selected.

Therefore, the output Y of the three-valued logic function circuit becomes s, t, and u according to the values −1, 0, and 1 of the input b.

In the three-valued logic function circuit, when an input a is 1, the one-variable three-valued logic function circuit C1 outputs −1 and the one-variable three-valued logic function circuit D1 obtaining an output complementarily symmetric with the signal thereof outputs 1. In addition, in the three-valued logic function circuit, when an input a is 1, the one-variable three-valued logic function circuit C3 outputs 1, and the one-variable three-valued logic function circuit D3 obtaining an output complementarily symmetric with the signal thereof outputs −1. The output of the one-variable three-valued logic function circuit C1 and the output of the one-variable three-valued logic function circuit D1 turn off the transfer gate T1. On the contrary, the output of the one-variable three-valued logic function circuit C3 and the output of the one-variable three-valued logic function circuit D3 turn on the transfer gate T3. In addition, the output of the one-variable three-valued logic function circuit D1 and the output of the one-variable three-valued logic function circuit C3 turn off the transfer gate T2. As a result, in the three-valued logic function circuit, only the transfer gate T3 is turned on, and the output of the one-variable three-valued logic function circuit B3=(x, y, z) connected to the input b is selected.

Therefore, the output Y of the three-valued logic function circuit becomes x, y, and z according to the values −1, 0, and 1 of the input b.

Consequently, in the three-valued logic function circuit, it is represented that all of the two-variable three-valued logic functions shown in Table 1 can be realized.

As described above, the three-valued logic function circuit can be configured by the three transfer gates T1, T2, and T3, the four kinds of one-variable three-valued logic function circuits $f_{19}$, $f_{09}$, $f_{03}$, and $f_{25}$, and the three any one-variable three-valued logic functions B1, B2, and B3, without the need to individually realize $3^{3^2}$=19683 kinds of all two-variable three-valued logic function circuits.

In one transfer gate T2 of three transfer gates T1, T2, and T3, pass transistors are connected in series, and logics with respect to the outputs of four kinds of one-variable three-valued logic functions connected to the gate terminals of the pass transistors are taken.

Any one-variable three-valued logic function circuit may be realized only by total 17 kinds of the seven kinds of inverse circuits $f_{10}$, $f_{13}$, $f_{19}$, $f_{22}$, $f_{23}$, $f_{25}$, and $f_{26}$, the five kinds of non-inverse circuits $f_{11}$, $f_{12}$, $f_{20}$, $f_{21}$, and $f_{24}$, and the complementary symmetry circuits $f_{04}$, $f_{07}$, $f_{08}$, $f_{16}$, and $f_{17}$ thereof, among the 27 kinds, as shown in table. 8.

The functions $f_{02}$, $f_{03}$, $f_{05}$, $f_{09}$, $f_{15}$, and $f_{18}$ can be realized by serial connection of the functions $f_{26}$ and $f_{13}$, serial connection of the functions $f_{25}$ and $f_{19}$, serial connection of the functions $f_{23}$ and $f_{13}$, serial connection of the functions $f_{19}$ and $f_{25}$, serial connection of the functions $f_{13}$ and $f_{23}$, and serial connection of the functions $f_{10}$, $f_{23}$, respectively.

Among the 27 kinds of one-variable three-valued logic functions, the function $f_{01}$ is identically −1, the function $f_{14}$ is identically 0, the function $f_{27}$ is identically 1, and in the function $f_{06}$, an input becomes an output as it is. Accordingly, it is not necessary to particularly realize these four kinds.

As described above, in the three-valued logic function circuit, it is possible to systemically realize all two-variable three-valued logic functions, using the three transfer gates T1, T2, and T3, and the 17 kinds of one-variable three-valued logic functions.

In these 17 kinds of one-variable three-valued logic function circuits, all transistors are turned off except the switching operation time, and current does not flows. Accordingly, it is possible to considerably reduce power consumption, as well as the normal CMOS two-valued logic function circuit.

Assuming realization by 0.1 μm CMOS technology, when acquiring channel dope amounts of enhancement and depletion MOS transistors in case of 0.3 volt corresponding to a logic value 1, 0 volt corresponding to a logic value 0, and −0.3 volt corresponding to a logic value −1, the result is as shown in Table 22.

TABLE 22

Channel dope amount of MOS: Nch

| MOSFET TYPE | NE | ne | nt | nd | PE | pe | pt | pd |
|---|---|---|---|---|---|---|---|---|
| Nch ($\times 10^{-17}$ cm$^{-3}$) | 30 | 2 | 1.19 | 0.177 | 14.6 | 2.88 | 2.88 | 0.595 |
| Threshold value (Vth) | 0.45 | 0.17 | 0.13 | −0.15 | −0.45 | −0.15 | −0.15 | 0.15 |

As described above, the aforementioned MOS transistors can be realized realistically, and the three-valued logic function circuit can be sufficiently realized.

In the three-valued logic function circuit, all three-valued logic elements can be configured using only one-variable three-valued logic function circuits and transfer gates. Accordingly, it is possible to considerably reduce asymmetry of the switching time of Start and End.

Actually, to confirm the effect of removing the asymmetry of the switching time, an XOR logic function circuit for carrying out a three-valued XOR logic function shown in Table 23 was configured, and a test was performed by a circuit simulator.

TABLE 23

Three-valued XOR logic function

| | b | | | |
|---|---|---|---|---|
| a | −1 | 0 | 1 | $f_{nn}$ |
| −1 | 1 | −1 | 0 | $f_{20}$ |
| 0 | −1 | 0 | 1 | $f_{06}$ |
| 1 | 0 | 1 | −1 | $f_{16}$ |

Figure 43:
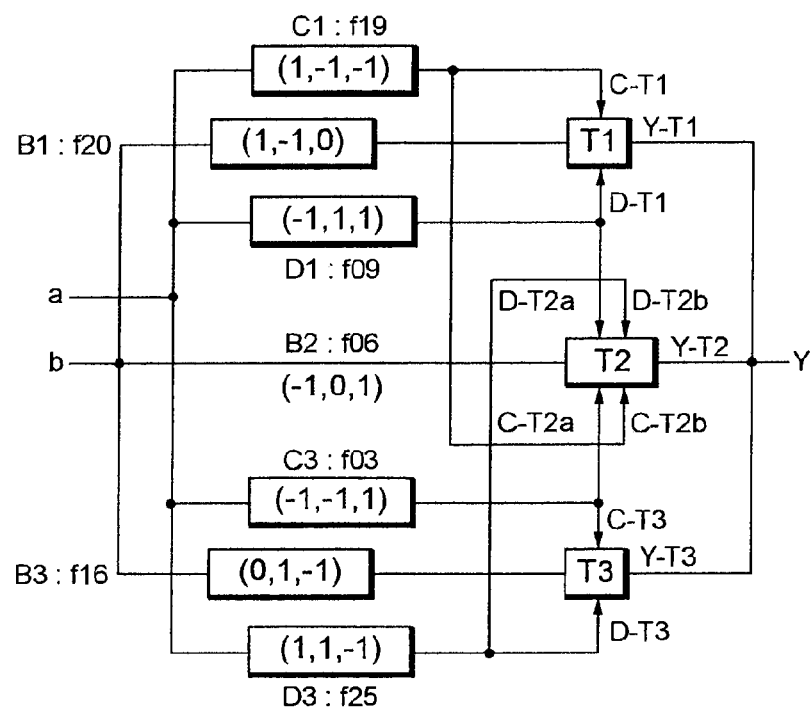
FIG. 43 is a diagram illustrating a configuration of a three-valued XOR logic function circuit configured by using the three-valued logic function circuit shown in FIG. 34.

The XOR logic function circuit, to which the three-valued logic function circuit according to the invention is applied, is configured as shown in FIG. 43. That is, in the XOR logic function circuit, the function $f_{19}$=(1, −1, −1) is used as the one-variable three-valued logic function circuit C1 shown in FIG. 33, the function $f_{09}$=(−1, 1, 1) is used as the one-variable three-valued logic function circuit D1, the function $f_{03}$=(−1, −1, 1) is used as the one-variable three-valued logic function circuit C3, the function $f_{25}$=(1, 1, −1) is used as the one-variable three-valued logic function circuit D3, additionally, the function $f_{20}$=(1, −1, 0) is provided as the one-variable three-valued logic function circuit B1, the function $f_{16}$=(0, 1, −1) is provided as the one-variable three-valued logic function circuit B3, and the one-variable three-valued logic function circuit B2 is the function $f_{06}$=(−1, 0, 1) in which an input becomes an output as it is. Therefore, it is not necessary to provide the one-variable three-valued logic function circuit B2.

Figure 44A:
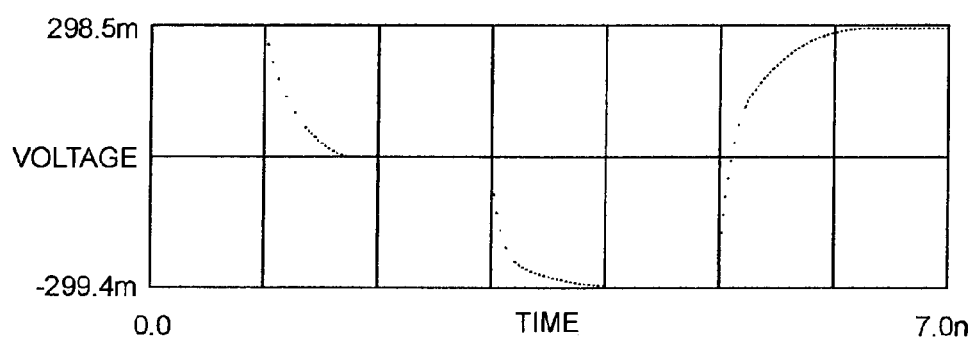
FIG. 44A is a diagram illustrating a waveform of an input a experimentally applied to the XOR logic function circuit shown in FIG. 43.
Figure 44B:
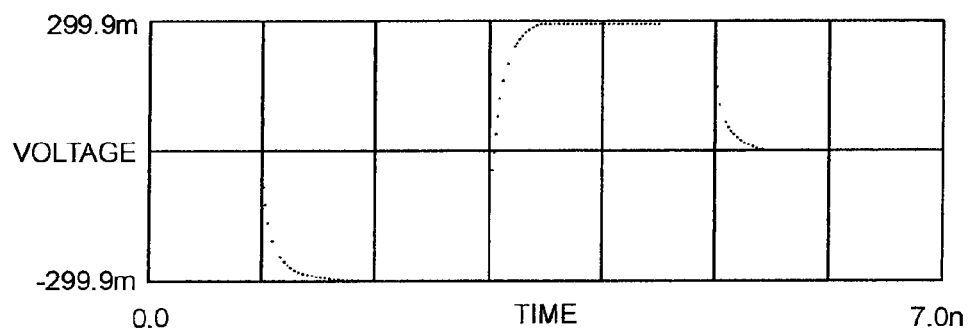
FIG. 44B is a diagram illustrating a waveform of an input b experimentally applied to the XOR logic function circuit shown in FIG. 43.
Figure 44C:
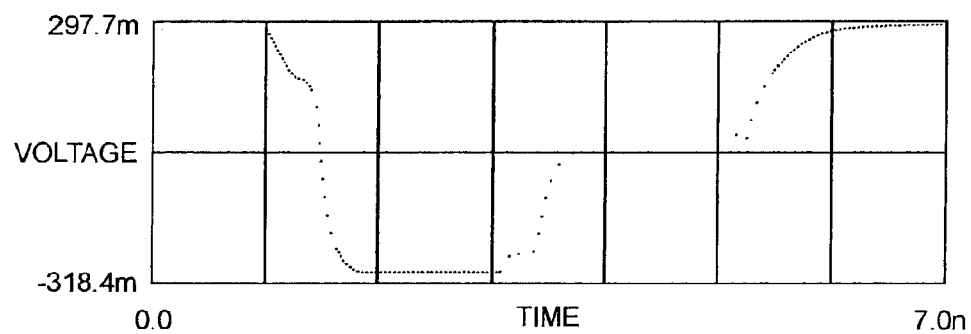
FIG. 44C is a diagram illustrating an output waveform when the inputs shown in FIG. 44A and FIG. 44B are applied to the XOR logic function circuit shown in FIG. 43.
Figure 45:
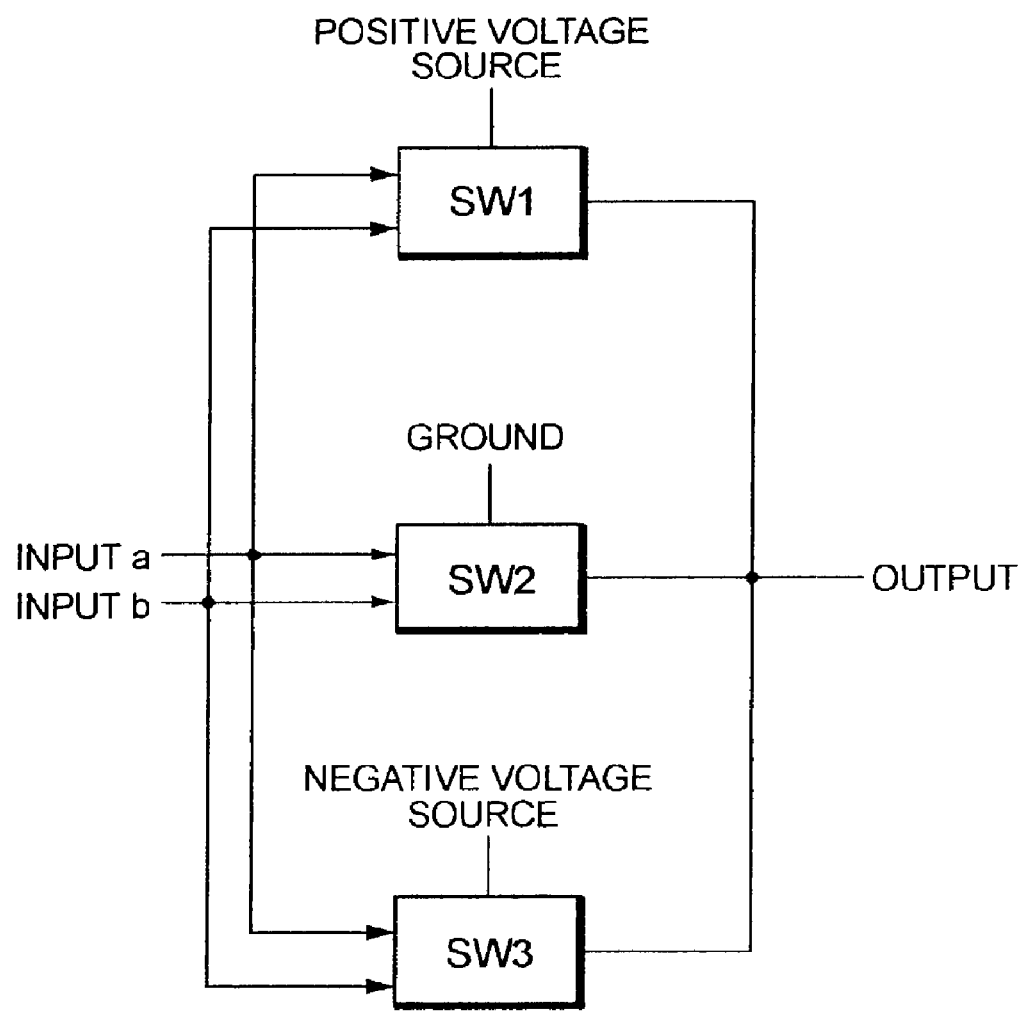
FIG. 45 is a diagram illustrating a configuration of the general three-valued logic function circuit.

As for such a three-valued XOR logic function circuit, an output waveform was acquired by a circuit simulator at the time of applying inputs a and b formed of patterns shown in FIGS. 44A and 44B. As a result, the output waveform of the XOR logic function circuit is as shown in FIG. 44C.

As can clearly known from the result, in the XOR logic function circuit configured by the three-valued logic function circuit according to the embodiment of the invention, both switching times of Start and End are substantially symmetric, and thus there is no case where both switching times of Start and End are largely asymmetric as conventional.

As described above, in the three-valued logic function circuit according to the embodiment of the invention, it is possible to remarkable reduce the asymmetry of the switching times of Start and End.

The invention is not limited to the above-described embodiment. For example, in the above-described embodiment, the example of application to the XOR logic function circuit has been described, but the invention is naturally applicable to the other circuits such as adding circuits and suitably applicable to hardware or large-size multiplication machines for performing so-called Public Key.

As described above, it is natural that the invention may be appropriately modified within the scope of the concept thereof.

The invention claimed is:

1. A three-valued logic function circuit that carries out a two-variable three-valued logic operation, the circuit comprising:
    a first transfer gate that is turned on according to a first logic value of three logic values constituting a first input;
    a second transfer gate that is configured by connecting a first switch pair of serial connection of two n-type MOS transistors and a second switch pair of serial connection of two p-type MOS transistors in parallel to each other, and that is turned on according to a second logic value of three logic values constituting the first input;
    a third transfer gate that is turned on according to a third logic value of three logic values constituting the first input;
    a first one-variable three-valued logic function circuit that is connected to one control terminal of two control terminals of the first transfer gate, and one control terminal of two control terminals of the first switch pair or the second switch pair constituting the second transfer gate, and that obtains a first output from the first input;
    a second one-variable three-valued logic function circuit that is connected to the other control terminal of two control terminals of the first transfer gate, and one control terminal of two control terminals of the switch pair different from the switch pair connected to the first one-variable three-valued logic function circuit of the first switch pair or the second switch pair constituting the second transfer gate, and that obtains a second output complementarily symmetric with the first output from the first input;
    a third one-variable three-valued logic function circuit that is connected to one control terminal of two control terminals of the third transfer gate, and the other control terminal of two control terminals of the same switch pair as the switch pair connected to the first one-variable three-valued logic function circuit of the first switch pair or the second switch pair constituting the second transfer gate, and that obtains a third output from the first input;
    a fourth one-variable three-valued logic function circuit that is connected to the other control terminal of two control terminals of the third transfer gate, and the other control terminal of two control terminals of the same switch pair as the switch pair connected to the second one-variable three-valued logic function circuit of the first switch pair or the second switch pair constituting the second transfer gate, and that obtains a fourth output complementarily symmetric with the third output from the first input;
    a fifth one-variable three-valued logic function circuit that is connected to an input terminal of the first transfer gate, and that obtains a fifth output according to a first logic value of three logic values constituting a second input;
    a sixth one-variable three-valued logic function circuit that is connected to an input terminal of the second transfer gate, and that obtains a sixth output according to a second logic value of three logic values constituting the second input; and
    a seventh one-variable three-valued logic function circuit that is connected to an input terminal of the third transfer gate, and that obtains a seventh output according to a third logic value of three logic values constituting the second input,
    wherein output terminals of the first to third transfer gates are connected by Wired OR.

2. The three-valued logic function circuit according to claim 1, wherein the first transfer gate is turned on according to a logic value −1 of three logic values −1, 0, and 1 constituting the first input,
    the second transfer gate is turned on according to a logic value 0 of three logic values −1, 0, and 1 constituting the first input,
    the third transfer gate is turned on according to a logic value 1 of three logic values −1, 0, and 1 constituting the first input,
    the first one-variable three-valued logic function circuit obtains an output (1, −1, −1) from the first input (−1, 0, 1),
    the second one-variable three-valued logic function circuit obtains an output (−1, 1, 1) from the first input (−1, 0, 1),
    the third one-variable three-valued logic function circuit obtains an output (−1, −1, 1) from the first input (−1, 0, 1), and
    the fourth one-variable three-valued logic function circuit obtains an output (1, 1, −1) from the first input (−1, 0, 1).

3. The three-valued logic function circuit according to claim 1, further comprising, instead of the second one-variable three-valued logic function circuit, an inverter that is connected to the other control terminal of two control terminals of the first transfer gate, and the other control terminal of two control terminals of the same switch pair as the switch pair connected to the first one-variable three-valued logic function circuit of the first switch pair or the second switch pair constituting the second transfer gate, and that inverts an output of the first one-variable three-valued logic function circuit.

4. The three-valued logic function circuit according to claim 1 or 3, further comprising, instead of the third one-variable three-valued logic function circuit, an inverter that is connected to one control terminal of two control terminals of the third transfer gate, and one control terminal of two control terminals of the switch pair different from the switch pair connected to the first one-variable three-valued logic function circuit of the first switch pair or the second switch pair constituting the second transfer gate, and that inverts an output of the fourth one-variable three-valued logic function circuit.

5. The three-valued logic function circuit according to any one of claims 1 to 3, wherein each of the first to third transfer gates is formed of an enhancement n-type MOS transistor and an enhancement p-type MOS transistor,
    the enhancement n-type MOS transistor has a positive threshold voltage smaller than a threshold voltage of a normal enhancement n-type transistor, and
    the enhancement p-type MOS transistor has a negative threshold voltage smaller in absolute value than a threshold voltage of a normal enhancement p-type transistor.

6. The three-valued logic function circuit according to any one of claims 1 to 3, wherein each of the fifth to seventh one-variable three-valued logic function circuit is any one of a first inverse circuit that obtains an output (0, −1, −1) from the second input (−1, 0, 1), a second inverse circuit that obtains an output (0, 0, −1) from the second input (−1, 0, 1), a third inverse circuit that obtains an output (1, −1, −1) from the second input (−1, 0, 1), a fourth inverse circuit that obtains an output (1, 0, −1) from the second input (−1, 0, 1), a fifth inverse circuit that obtains an output (1, 0, 0) from the second input (−1, 0, 1), a sixth inverse circuit that obtains an output (1, 1, −1) from the second input (−1, 0, 1), a seventh inverse circuit that obtains an output (1, 1, 0) from the second input (−1, 0, 1), a first non-inverse circuit that obtains an output (0, −1, 0) from the second input (−1, 0, 1), a second non-inverse circuit that obtains an output (0, −1, 1) from the second input (−1, 0, 1), a third non-inverse circuit that obtains an output (1, −1, 0) from the second input (−1, 0, 1), a fourth non-inverse circuit that obtains an output (1, −1, 1) from the second input (−1, 0, 1), a fifth non-inverse circuit that obtains an output (1, 0, 1) from the second input (−1, 0, 1), a first complementary symmetry circuit that obtains an output complementarily symmetric with the output of the first non-inverse circuit, a second complementary symmetry circuit that obtains an output complementarily symmetric with the output of the second non-inverse circuit, a third complementary symmetry circuit that obtains an output complementarily symmetric with the output of the third non-inverse circuit, a fourth complementary symmetry circuit that obtains an output complementarily symmetric with the output of the fourth non-inverse circuit, and a fifth complementary symmetry circuit that obtains an output complementarily symmetric with the output of the fifth non-inverse circuit.

7. The three-valued logic function circuit according to claim 6, wherein the third non-inverse circuit has an enhancement p-type MOS transistor connected to a source logic value 0 having a negative threshold voltage smaller in absolute value than a threshold voltage of a normal enhancement p-type transistor,
the fifth non-inverse circuit has an enhancement n-type MOS transistor connected to a source logic value 0 having a positive threshold voltage smaller than a threshold voltage of a normal enhancement n-type transistor,
the second complementary symmetry circuit has an enhancement n-type MOS transistor connected to a source logic value 0 having a positive threshold voltage smaller than a threshold voltage of a normal enhancement n-type transistor, and
the fifth complementary symmetry circuit has an enhancement p-type MOS transistor connected to a source logic value 0 having a negative threshold voltage smaller in absolute value than a threshold voltage of a normal enhancement p-type transistor.

8. The three-valued logic function circuit according to claim 4, wherein each of the first to third transfer gates is formed of an enhancement n-type MOS transistor and an enhancement p-type MOS transistor,
the enhancement n-type MOS transistor has a positive threshold voltage smaller than a threshold voltage of a normal enhancement n-type transistor, and
the enhancement p-type MOS transistor has a negative threshold voltage smaller in absolute value than a threshold voltage of a normal enhancement p-type transistor.

9. The three-valued logic function circuit according to claim 4, wherein each of the fifth to seventh one-variable three-valued logic function circuit is any one of a first inverse circuit that obtains an output (0, −1, −1) from the second input (−1, 0, 1), a second inverse circuit that obtains an output (0, 0, −1) from the second input (−1, 0, 1), a third inverse circuit that obtains an output (1, −1, −1) from the second input (−1, 0, 1), a fourth inverse circuit that obtains an output (1, 0, −1) from the second input (−1, 0, 1), a fifth inverse circuit that obtains an output (1, 0, 0) from the second input (−1, 0, 1), a sixth inverse circuit that obtains an output (1, 1, −1) from the second input (−1, 0, 1), a seventh inverse circuit that obtains an output (1, 1, 0) from the second input (−1, 0, 1), a first non-inverse circuit that obtains an output (0, −1, 0) from the second input (−1, 0, 1), a second non-inverse circuit that obtains an output (0, −1, 1) from the second input (−1, 0, 1), a third non-inverse circuit that obtains an output (1, −1, 0) from the second input (−1, 0, 1), a fourth non-inverse circuit that obtains an output (1, −1, 1) from the second input (−1, 0, 1), a fifth non-inverse circuit that obtains an output (1, 0, 1) from the second input (−1, 0, 1), a first complementary symmetry circuit that obtains an output complementarily symmetric with the output of the first non-inverse circuit, a second complementary symmetry circuit that obtains an output complementarily symmetric with the output of the second non-inverse circuit, a third complementary symmetry circuit that obtains an output complementarily symmetric with the output of the third non-inverse circuit, a fourth complementary symmetry circuit that obtains an output complementarily symmetric with the output of the fourth non-inverse circuit, and a fifth complementary symmetry circuit that obtains an output complementarily symmetric with the output of the fifth non-inverse circuit.

10. The three-valued logic function circuit according to claim 5, wherein each of the fifth to seventh one-variable three-valued logic function circuit is any one of a first inverse circuit that obtains an output (0, −1, −1) from the second input (−1, 0, 1), a second inverse circuit that obtains an output (0, 0, −1) from the second input (−1, 0, 1), a third inverse circuit that obtains an output (1, −1, −1) from the second input (−1, 0, 1), a fourth inverse circuit that obtains an output (1, 0, −1) from the second input (−1, 0, 1), a fifth inverse circuit that obtains an output (1, 0, 0) from the second input (−1, 0, 1), a sixth inverse circuit that obtains an output (1, 1, −1) from the second input (−1, 0, 1), a seventh inverse circuit that obtains an output (1, 1, 0) from the second input (−1, 0, 1), a first non-inverse circuit that obtains an output (0, −1, 0) from the second input (−1, 0, 1), a second non-inverse circuit that obtains an output (0, −1, 1) from the second input (−1, 0, 1), a third non-inverse circuit that obtains an output (1, −1, 0) from the second input (−1, 0, 1), a fourth non-inverse circuit that obtains an output (1, −1, 1) from the second input (−1, 0, 1), a fifth non-inverse circuit that obtains an output (1, 0, 1) from the second input (−1, 0, 1), a first complementary symmetry circuit that obtains an output complementarily symmetric with the output of the first non-inverse circuit, a second complementary symmetry circuit that obtains an output complementarily symmetric with the output of the second non-inverse circuit, a third complementary symmetry circuit that obtains an output complementarily symmetric with the output of the third non-inverse circuit, a fourth complementary symmetry circuit that obtains an output complementarily symmetric with the output of the fourth non-inverse circuit, and a fifth complementary symmetry circuit that obtains an output complementarily symmetric with the output of the fifth non-inverse circuit.

11. The three-valued logic function circuit according to claim 9, wherein the third non-inverse circuit has an enhancement p-type MOS transistor connected to a source logic value 0 having a negative threshold voltage smaller in absolute value than a threshold voltage of a normal enhancement p-type transistor,
the fifth non-inverse circuit has an enhancement n-type MOS transistor connected to a source logic value 0 having a positive threshold voltage smaller than a threshold voltage of a normal enhancement n-type transistor,
the second complementary symmetry circuit has an enhancement n-type MOS transistor connected to a source logic value 0 having a positive threshold voltage smaller than a threshold voltage of a normal enhancement n-type transistor, and the fifth complementary symmetry circuit has an enhancement p-type MOS transistor connected to a source logic value 0 having a negative threshold voltage smaller in absolute value than a threshold voltage of a normal enhancement p-type transistor.

12. The three-valued logic function circuit according to claim 10, wherein the third non-inverse circuit has an enhancement p-type MOS transistor connected to a source logic value 0 having a negative threshold voltage smaller in absolute value than a threshold voltage of a normal enhancement p-type transistor, the fifth non-inverse circuit has an enhancement n-type MOS transistor connected to a source logic value 0 having a positive threshold voltage smaller than a threshold voltage of a normal enhancement n-type transistor, the second complementary symmetry circuit has an enhancement n-type MOS transistor connected to a source logic value 0 having a positive threshold voltage smaller than a threshold voltage of a normal enhancement n-type transistor, and the fifth complementary symmetry circuit has an enhancement p-type MOS transistor connected to a source logic value 0 having a negative threshold voltage smaller in absolute value than a threshold voltage of a normal enhancement p-type transistor.

* * * * *

UNITED STATES PATENT AND TRADEMARK OFFICE
CERTIFICATE OF CORRECTION

| | |
|---|---|
| PATENT NO. | : 7,755,391 B2 |
| APPLICATION NO. | : 12/162760 |
| DATED | : July 13, 2010 |
| INVENTOR(S) | : Hibino et al. |

It is certified that error appears in the above-identified patent and that said Letters Patent is hereby corrected as shown below:

On Title Page 2, Item (56), under "OTHER PUBLICATIONS", in Column 2, Line 5, delete "Muliple-Valued" and insert -- Multiple-Valued --, therefor.

On Title Page 2, Item (56), under "OTHER PUBLICATIONS", in Column 2, Line 8, delete "Circuts" and insert -- Circuits --, therefor.

In the Specifications

In Column 1, Line 35, delete "7-212220" and insert -- 7-212220. --, therefor.

In Column 1, Line 39, delete "(1990/02)" and insert -- (1990/02). --, therefor.

In Column 1, Line 44, delete "(1994)" and insert -- (1994). --, therefor.

In Column 1, Line 47, delete "Tnt" and insert -- Int --, therefor.

In Column 1, Line 48, delete "(2002)" and insert -- (2002). --, therefor.

In Column 1, Line 59, delete "2002-517937" and insert -- 2002-517937. --, therefor.

In Column 12, Line 29, delete "X," and insert -- x, --, therefor.

In Column 12, Line 46, delete "function-circuit" and insert -- function circuit --, therefor.

In Column 13, Line 49, delete "($V_{gs}$=20.0)." and insert -- ($V_{gs}$=2.0). --, therefor.

In Column 16, Line 32, delete "$f_{19}$" and insert -- $f_{18}$ --, therefor.

In Column 19, Line 43, delete "$f_{25}$=(, 1," and insert -- $f_{25}$=(1, 1, --, therefor.

Signed and Sealed this
Thirtieth Day of April, 2013

Teresa Stanek Rea
*Acting Director of the United States Patent and Trademark Office*

CERTIFICATE OF CORRECTION (continued)
U.S. Pat. No. 7,755,391 B2

In Column 20, Line 8, delete "in stead" and insert -- instead --, therefor.

In Column 21, Line 34, delete "in stead" and insert -- instead --, therefor.

In Column 21, Line 65, delete "fig," and insert -- $f_{19}$, --, therefor.

In Column 22, Line 64, delete "in stead" and insert -- instead --, therefor.

In Column 24, Line 42, delete "in stead" and insert -- instead --, therefor.

In Column 24, Line 53, delete "for" and insert -- $f_{07}$, --, therefor.

In Column 24, Line 60, delete " ※ 「それぞれ」と表現していただけますでしょうか。"

In Column 25, Line 20, delete "$f_{09}/f_{15}$," and insert -- $f_{09}$, $f_{15}$, --, therefor.

In Column 26, Line 53, delete "B11=(p, q, r)" and insert -- B1=(p, q, r) --, therefor.